(12) United States Patent
Imanishi et al.

(10) Patent No.: US 12,202,958 B2
(45) Date of Patent: Jan. 21, 2025

(54) POLYPROPYLENE FILM, METAL LAYER LAMINATED FILM USING POLYPROPYLENE FILM, AND FILM CAPACITOR

(71) Applicant: Toray Industries, Inc., Tokyo (JP)

(72) Inventors: Yasuyuki Imanishi, Otsu (JP); Masatoshi Ohkura, Otsu (JP); Yuta Nakanishi, Otsu (JP)

(73) Assignee: Toray Industries, Inc., Tokyo (JP)

( * ) Notice: Subject to any disclaimer, the term of this patent is extended or adjusted under 35 U.S.C. 154(b) by 603 days.

(21) Appl. No.: 17/431,589

(22) PCT Filed: Feb. 20, 2020

(86) PCT No.: PCT/JP2020/006754
§ 371 (c)(1),
(2) Date: Aug. 17, 2021

(87) PCT Pub. No.: WO2020/171163
PCT Pub. Date: Aug. 27, 2020

(65) Prior Publication Data
US 2022/0135780 A1 May 5, 2022

(30) Foreign Application Priority Data

Feb. 21, 2019 (JP) .................... 2019-029182
Feb. 21, 2019 (JP) .................... 2019-029183
Feb. 21, 2019 (JP) .................... 2019-029184

(51) Int. Cl.
*C08L 23/12* (2006.01)
*H01G 4/18* (2006.01)
*H01G 4/33* (2006.01)

(52) U.S. Cl.
CPC .............. *C08L 23/12* (2013.01); *H01G 4/18* (2013.01); *H01G 4/33* (2013.01); *C08L 2203/16* (2013.01)

(58) Field of Classification Search
CPC .... C08L 23/12; C08L 2203/16; C23C 14/022; C23C 14/14; C23C 14/562; C08J 2323/12; C08J 5/18; B29C 55/14; B29C 61/06; B32B 15/08; B32B 2323/10
USPC ........................................................ 524/582
See application file for complete search history.

(56) References Cited

U.S. PATENT DOCUMENTS

| | | |
|---|---|---|
| 6,071,598 A * | 6/2000 | Peiffer ............... B32B 27/32 526/348.1 |
| 9,449,761 B2 | 9/2016 | Tan et al. |
| 2011/0014408 A1 | 1/2011 | Fujiwara et al. |
| 2020/0198298 A1 | 6/2020 | Imanishi et al. |

FOREIGN PATENT DOCUMENTS

| | | |
|---|---|---|
| JP | 02129905 A | 5/1990 |
| JP | 2002248681 A | 9/2002 |
| JP | 2007084813 A | 4/2007 |
| JP | 2010280795 A | 12/2010 |
| JP | 2014231604 A | 12/2014 |
| JP | 2016033211 A | 3/2016 |
| JP | 2016187959 A | 11/2016 |
| WO | 2009008340 A1 | 1/2009 |
| WO | 2009060944 A1 | 5/2009 |
| WO | 2015146894 A1 | 10/2015 |
| WO | 2016043172 A1 | 3/2016 |
| WO | 2016182003 A1 | 11/2016 |
| WO | 2017159103 A1 | 9/2017 |
| WO | 2018181271 A1 | 10/2018 |
| WO | 2019044758 A1 | 3/2019 |
| WO | 2020040127 A1 | 2/2020 |

OTHER PUBLICATIONS

International Search Report and Written Opinion for International Application No. PCT/JP2020/006754, dated Apr. 21, 2020, 6 pages.
Kawai, M., "Film Capacitor Breakthrough, from Car to Energy", Sep. 17, 2012, 8 pages, Nikkei Electronics, Nikkei Business Publications (with partial English translation).

* cited by examiner

*Primary Examiner* — Hannah J Pak
(74) *Attorney, Agent, or Firm* — Buchanan Ingersoll & Rooney PC

(57) ABSTRACT

Provided are a polypropylene film that has excellent structural stability relative to heat, is suitable for use in high-voltage capacitors or the like, and, when used in a high-voltage capacitor, has excellent long-term reliability in high-temperature environments; a metal layer laminated film that uses the polypropylene film; and a film capacitor. The polypropylene film has the sum of F5 values for the longitudinal direction and the width direction at 130° C. of at least 15 MPa and, for dielectric breakdown testing at 130° C., a dielectric breakdown voltage (B150) (V/μm) after heat treating for 1 minute at 150° C. and a dielectric breakdown voltage (B0) (V/μm) without heat treating satisfy the following relationship.

(B150)/(B0)≥0.80

4 Claims, 1 Drawing Sheet

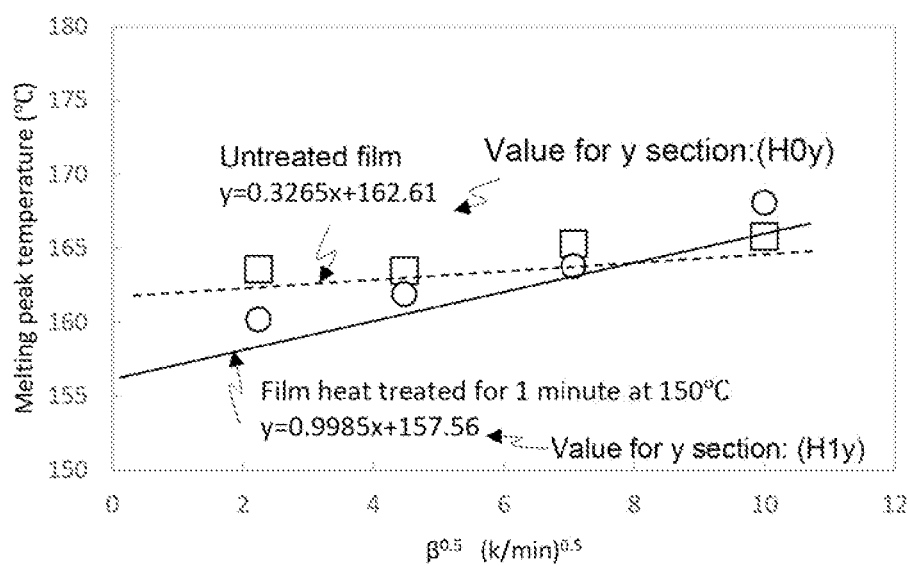

POLYPROPYLENE FILM, METAL LAYER LAMINATED FILM USING POLYPROPYLENE FILM, AND FILM CAPACITOR

CROSS REFERENCE TO RELATED APPLICATIONS

This is the U.S. National Phase application of PCT/JP2020/006754, filed Feb. 20, 2020, which claims priority to Japanese Patent Application No. 2019-029182, filed Feb. 21, 2019, Japanese Patent Application No. 2019-029183, filed Feb. 21, 2019 and Japanese Patent Application No. 2019-0291.84, filed Feb. 21, 2019, the disclosures of each of these applications being incorporated herein by reference in their entireties for all purposes.

FIELD OF THE INVENTION

The present invention particularly relates to a polypropylene film suitably used for capacitor applications.

BACKGROUND OF THE INVENTION

Since polypropylene films are excellent in transparency, mechanical properties, electrical properties, and the like, the polypropylene films have been used in various applications such as packaging applications, tape applications, and electrical applications including cable wrapping and capacitors.

Among them, in capacitor applications, the polypropylene film is particularly preferably used for high voltage capacitors of either direct current or alternating current due to the excellent voltage resistance and low loss characteristics thereof.

Recently, various electric devices have been inverterized, and accordingly, demands for miniaturization and capacity enlargement of capacitors have been further increased. In response to such a demand, particularly from automobile applications (including hybrid car applications), solar power generation, and wind power generation applications, the polypropylene film has been required to have a reduced film thickness, improved dielectric breakdown voltage, and excellent reliability capable of maintaining characteristics in long-term use in a high-temperature environment.

The polypropylene film has been considered to have high heat resistance and high dielectric breakdown voltage among polyolefin-based films. On the other hand, in application to the above-mentioned fields, it is important to exhibit excellent dimensional stability at a use environmental temperature and stable performance as electrical performance such as electrical resistance even in a region 10° C. to 20° C. higher than the use environmental temperature. Here, from the viewpoint of the heat resistance, when considering power semiconductor applications using silicon carbide (SiC) in the future, the use environmental temperature is said to be higher. From the demand for higher heat resistance and higher voltage resistance as a capacitor, the improvement of a dielectric breakdown voltage of a film under a high-temperature environment exceeding 110° C. is required. However, as disclosed in Non-Patent Document 1, the upper limit of operating temperature of the polypropylene film is said to be about 110° C., and it has been extremely difficult to stably maintain the dielectric breakdown voltage under such a temperature environment. In addition, it is considered that the film itself has a thermal history of up to around 150° C. in the process of vapor deposition processing of the film, and in a case of a film that is unstable in heat, when a film structure is relaxed during the vapor deposition processing, it has been difficult to sufficiently exhibit the voltage resistance performance originally possessed by the film as a capacitor.

As a method for obtaining excellent performance in a high-temperature environment when a polypropylene film is made into a thin film and is used as a capacitor, for example, there have been proposed a film in which capacitor characteristics and reliability at a high temperature are improved by controlling stress at an elongation of 50% in a longitudinal direction at 125° C. (for example, Patent Document 1), and a film in which stretchability is improved by adding a melt-type nucleating agent to polypropylene having a high melting point and mechanical strength of a film at 125° C. is improved (for example, Patent Document 2). Furthermore, there have been proposed a film in which a highly stereoregular polypropylene raw material is rapidly cooled after melt-extrusion to form a mesomorphic phase on a cast sheet, thereby improving the degree of crystal orientation of the film (for example, Patent Document 3), and a film in which a highly stereoregular polypropylene resin is used, the oxygen concentration in an extrusion hopper is reduced, and the additional amount of an antioxidant is optimized to improve the filtration accuracy of a filter, thereby improving the dielectric breakdown voltage (for example, Patent Document 4).

In addition, as a method for obtaining excellent performance in a high-temperature environment when a polypropylene film is made into a thin film and is used as a capacitor, for example, there have been proposed a film in which the relaxation time of an amorphous component of polypropylene in an atmosphere at 70° C. and the relaxation time of an intermediate component are controlled (for example, Patent Document 5), and a film in which the dielectric breakdown voltage is improved by controlling a storage elastic modulus at 125° C. to have a small change with respect to the storage elastic modulus at room temperature (for example, Patent Document 6). Furthermore, there have been proposed a sheet in which a polypropylene film is formed by melt-extruding a highly stereoregular polypropylene raw material having a high elastic modulus at a high temperature, then rapidly cooling the polypropylene raw material, and then heat-treating the polypropylene raw material (for example, Patent Document 7), and a biaxially stretched film in which the high-temperature dielectric breakdown voltage at 100° C. is improved by controlling the molecular weight distribution and stereoregularity of the polypropylene raw material (for example, Patent Document 8).

Furthermore, as a method for obtaining a polypropylene film having a high melting point of the film measured by DSC in order to obtain excellent performance in a high-temperature environment when a polypropylene film is made into a thin film and is used as a capacitor, for example, there have been proposed a biaxially stretched film in which shearing of a spinneret and cast adhesion when a molten resin from the spinneret is extruded are controlled (for example, Patent Document 9), a film obtained by biaxially stretching a PP resin pellet or a film sheet by irradiation with an electron beam or a gamma ray (for example, Patent Document 10), a film obtained by blending two kinds of polypropylene resins having different molecular weight distributions and biaxially stretching the blended polypropylene resins (for example, Patent Document 11), and a film obtained by biaxially stretching a high-crystal PP resin having improved stereoregularity of the PP resin and then subjecting the biaxially stretched film to re-longitudinal stretching (for example, Patent Document 12).

PATENT DOCUMENTS

Patent Document 1: Japanese Patent Laid-open Publication No. 2016-033211
Patent Document 2: PCT International Publication No. WO 2016/043172
Patent Document 3: PCT International Publication No. WO 2016/182003
Patent Document 4: PCT International Publication No. WO 2017/159103
Patent Document 5: Japanese Patent Laid-open Publication No. 2002-248681
Patent Document 6: PCT International Publication No. WO 2015/146894
Patent Document 7: PCT International Publication No. WO 2009/008340
Patent Document 8: PCT International Publication No. WO 2009/060944
Patent Document 9: Japanese Patent Laid-open Publication No. 2016-187959
Patent Document 10: Japanese Patent Laid-open Publication No. 2014-231604
Patent Document 11: Japanese Patent Laid-open Publication No. 2010-280795
Patent Document 12: Japanese Patent Laid-open Publication No. 02-129905

NON-PATENT DOCUMENT

Non-Patent Document 1: MOTONOBU KAWAI: "Film Capacitor Breakthrough, from Car to Energy", NIKKEI ELECTRONICS, Nikkei Business Publications, Inc., 17 Sep. 2012, pages 57-62

SUMMARY OF THE INVENTION

However, the polypropylene films disclosed in Patent Documents 1 to 12 are not sufficiently improved in the dielectric breakdown voltage in high-temperature environments exceeding 110° C., and it is difficult to say that the polypropylene films are sufficient in terms of reliability for long-term use in high-temperature environments when used as a capacitor.

Here, an object of the present invention is to provide a polypropylene film that has excellent structural stability against heat, and is suitable for use in the capacitor and the like used under high temperature and high voltage, and has excellent long-term reliability for usage under high-temperature environments; a metal layer laminated film; and a film capacitor using the polypropylene film.

The present inventors have conducted intensive studies in order to solve the above problems, and achieved the following embodiments of the present invention. That is, (1) A polypropylene film for which a sum of F5 values for a longitudinal direction and a width direction at 130° C. is at least 15 MPa and for which, for dielectric breakdown testing at 130° C., a dielectric breakdown voltage (B150) (V/μm) after heat treatment for 1 minute at 150° C. and a dielectric breakdown voltage (B0) (V/μm) without heat treatment satisfy the following relationship (first embodiment).

$$(B150)/(B0) \geq 0.80$$

(2) A polypropylene film wherein, for a relaxation time T2 of an amorphous component obtained by a pulse NMR method, a relationship between a relaxation time (T2A) (μs) after a heat treatment for 1 minute at 150° C. and a relaxation time (T2B) (μs) before the heat treatment satisfies the following formula (second embodiment).

$$(T2B)/(T2A) \geq 0.90$$

(3) A polypropylene film wherein in a linear function $((Tm\beta) = x\beta^{0.5} + y)$ obtained from a relationship in which a melting peak temperature (Tmβ) (° C.) observed by DSC measurement of each of a film (hereinafter, referred to as a treated film) heat treated for 1 minute at 150° C. and an untreated film (hereinafter, referred to as an untreated film) at a temperature raising rate β (° C./min) is defined as a Y axis, and a value (hereinafter, referred to as $\beta^{0.5}$) obtained by raising the temperature raising rate β (° C./min) to the power of 0.5 is defined as an X axis, a relationship between a y-section (H1y) (° C.) of the linear function in the treated film and a y-section (H0y) (° C.) of the linear function in the untreated film satisfies the following relationship (third embodiment).

$$(H1y)/(H0y) \geq 0.90$$

According to an embodiment of the present invention, there is provided a polypropylene film that has excellent structural stability against heat, is suitable for use in the capacitor and the like used under high temperature and high voltage, and has excellent long-term use reliability in high-temperature environments. In addition, a metal layer laminated film and a film capacitor using the same are provided.

BRIEF DESCRIPTION OF THE DRAWINGS

The FIGURE is a diagram for explaining a linear function $((Tm\beta) = x\beta^{0.5} + y)$ obtained from a relationship in which a melting peak temperature (Tmβ) (° C.) is defined as a Y axis and a value ($\beta^{0.5}$) obtained by raising a temperature raising rate β (° C./min) to the power of 0.5 is defined as an X axis.

DETAILED DESCRIPTION OF EMBODIMENTS OF THE INVENTION

The present inventors have intensively studied to solve the above-mentioned problems, and considered the reason why the polypropylene film disclosed in Patent Document 1 to 4 has insufficient dielectric breakdown voltage in a high-temperature environment and insufficient long-term use reliability in high-temperature environments when used as a capacitor as follows.

That is, it can be said that the polypropylene films disclosed in Patent Document 1 and Patent Document 2 have sufficient voltage resistance and reliability in an environment at 105° C. as a capacitor, but when assuming voltage resistance in a further high-temperature environment, it is considered that the stretch ratio in film formation, preheating and heat treatment during lateral stretching are not necessarily sufficient, and there is a problem that an amorphous structure of the film is relaxed at a higher temperature, and a dielectric breakdown voltage is lowered. Also in Patent Document 3, when assuming the voltage resistance in the high-temperature environment, it is considered that preheating and heat treatment at the time of lateral stretching in film formation are not necessarily sufficient, and slow cooling treatment is not performed at a heat treatment temperature after lateral stretching, and therefore a large amount of movable amorphous components are present in the film, so that the dielectric breakdown voltage at a high temperature may be lowered. In Patent Document 4, there is no idea of controlling a cold xylene soluble component (CXS) contained in a raw material, and since a stretch ratio and slow cooling during the lateral stretching in film formation are not sufficient, the improvement of crystallinity is not sufficient, and therefore voltage resistance at a high temperature may be poor.

Based on the above consideration, the present inventors have further studied and found that the above problem can be solved by forming a film in which the sum of F5 values at 130° C. in a longitudinal direction and a width direction of the polypropylene film, and the relationship between the dielectric breakdown voltage before and after heat treatment for 1 minute at 150° C., are certain values or more.

That is, the present invention according to an embodiment is a polypropylene film for which the sum of F5 values for the longitudinal direction and the width direction at 130° C. is 15 MPa or more, and for which, for dielectric breakdown testing at 130° C., the dielectric breakdown voltage (B150) (V/μm) after heat treatment for 1 minute at 150° C. and the dielectric breakdown voltage (B0) (V/μm) without heat treatment satisfy the following relationship.

$(B150)/(B0) \geq 0.80$

The heat treatment for 1 minute at 150° C. simulates heat received when the polypropylene film is subjected to vapor deposition and element processing, and the above formula means that the structural change due to the element processing is small. The present inventors have found that this has a high correlation with the fact that a capacitor element exhibits excellent capacitor characteristics in long-term use in a high-temperature environment, and have completed an embodiment of the present invention.

In addition, the present inventors have considered the reason why the polypropylene film disclosed in Patent Document 5 to 8 has insufficient dielectric breakdown voltage in a high-temperature environment and insufficient long-term use reliability in high-temperature environments when used as a capacitor as follows.

That is, since the polypropylene film disclosed in Patent Document 5 is obtained by adding a propylene-based random copolymer to a polypropylene resin for the purpose of imparting high rigidity and antistatic properties for packaging, it is considered that the heat resistance of the copolymer is insufficient in a high-temperature environment exceeding 105° C. and the polypropylene film is not suitable for a capacitor. That is, it can be said that the polypropylene film disclosed in Patent Document 6 has sufficient voltage resistance and reliability in an environment at 105° C. as a capacitor, but when assuming voltage resistance in a further high-temperature environment, it is considered that in film formation, preheating and heat treatment during lateral stretching are not necessarily sufficient, and there is a problem that since the raw material contains a large amount of cold xylene soluble component (CXS), it is difficult to increase the degree of crystallinity, and the relaxation time of an amorphous component of the film decreases at a high temperature. The polypropylene film disclosed in Patent Document 7 is an unstretched sheet, and the reason for this is considered to be that the voltage resistance and reliability in an environment exceeding 105° C. as a capacitor are lowered without a technical idea of biaxially stretching a sheet having excellent rigidity to exhibit voltage resistance performance. Since the polypropylene film disclosed in Patent Document 8 uses a polypropylene resin having high stereoregularity, it is recognized that the polypropylene film has voltage resistance and reliability in an environment of 100° C. However, when assuming the voltage resistance in a further high-temperature environment, preheating and heat treatment during lateral stretching are not necessarily sufficient in film formation, a large amount of movable amorphous components are present in the film, the preheating temperature before the lateral stretching is low, and slow cooling treatment is not performed at the heat treatment temperature after the lateral stretching. Therefore, it is considered that the reason for this is that the stabilization of the molecular chain orientation structure is insufficient, and the relaxation time of the amorphous components at a high temperature is lowered.

Based on the above consideration, the present inventors have further studied and found that the above problem can be solved by forming the polypropylene film as a film in which a relationship of the relaxation time of an amorphous component before and after heat treatment for 1 minute at 150° C. is a certain value or more.

That is, the present invention according to an embodiment is a polypropylene film wherein, for a relaxation time T2 of an amorphous component obtained by a pulse NMR method, a relationship between a relaxation time (T2A) (μs) after heat treatment for 1 minute at 150° C. and a relaxation time (T2B) (μs) before the heat treatment satisfies the following formula.

$(T2B)/(T2A) \geq 0.90$

Furthermore, the present inventors have considered the reason why the polypropylene film disclosed in Patent Document 9 to 12 has insufficient dielectric breakdown voltage in a high-temperature environment and insufficient long-term use reliability in high-temperature environments when used as a capacitor as follows.

That is, it can be said that the polypropylene film disclosed in Patent Document 9 has sufficient voltage resistance and reliability in an environment at 105° C. as a capacitor, but when assuming voltage resistance in a further high-temperature environment, it is considered that in film formation, a stretch ratio, preheating and heat treatment during lateral stretching are not necessarily sufficient, and there is a problem that since the raw material contains a large amount of cold xylene soluble component (CXS), it is difficult to increase the degree of crystallinity, and the amorphous structure of the film relaxes at a higher temperature and to cause a decrease in a melting point. In addition, it can be said that the polypropylene film disclosed in Patent Document 10 has sufficient voltage resistance and reliability in an environment at 105° C. as a capacitor by irradiating a PP resin pellet or a film sheet with an electron beam or a gamma ray, it is considered that a stretch ratio is low in film formation, preheating and heat treatment during lateral stretching are not necessarily sufficient, and there is a problem that an amorphous structure of the film relaxes at a higher temperature to cause a decrease in a melting point. The polypropylene film disclosed in Patent Document 11 is considered to be used by blending a polypropylene resin having high stereoregularity with a polypropylene resin having a low molecular weight component, and since preheating and heat treatment during lateral stretching are not necessarily sufficient in film formation, there is a problem that an amorphous structure of the film relaxes at a higher temperature to cause a decrease in a melting point. In the polypropylene film disclosed in Patent Document 12, the degree of orientation is increased by performing stretching in two stages in a longitudinal stretching step in biaxial stretching with a polypropylene resin having high stereoregularity, and the voltage resistance and reliability in an environment at 105° C. are recognized. However, when assuming the voltage resistance in a further high-temperature environment, preheating and heat treatment during lateral stretching in film formation are not necessarily sufficient, and there is a problem that the amorphous structure of the film easily relaxes at a higher temperature to cause a decrease in a melting point.

Based on the above consideration, the present inventors have further studied and found that the above problem can be solved by forming the polypropylene film as a film in which a relationship of the change in film melting point before and after heat treatment for 1 minute at 150° C. is a certain value or more.

That is, the present invention according to an embodiment is a polypropylene film wherein in a linear function $((Tm\beta)=x\beta^{0.5}+y)$ obtained from a relationship in which a melting peak temperature (Tmβ) (° C.) observed by DSC measurement of each of a film (hereinafter, referred to as a treated film) heat treated for 1 minute at 150° C. and an untreated film (hereinafter, referred to as an untreated film) at a temperature raising rate β (° C./min) is defined as a Y axis, and a value (hereinafter, referred to as $\beta^{0.5}$) obtained by raising the temperature raising rate β (° C./min) to the power of 0.5 is defined as an X axis, a relationship between a y-section (H1y) (° C.) of the linear function in the treated film and a y-section (H0y) (° C.) of the linear function in the untreated film satisfies the following relationship.

$(H1y)/(H0y) \geq 0.90$

In the specification, the polypropylene film may be simply referred to as a film. In addition, in the description without notice of the first embodiment, the second embodiment, and the third embodiment, the embodiments of the invention of the polypropylene film are not particularly limited. Since the polypropylene film according to embodiments of the present invention is not a microporous film, it does not have a large number of pores. That is, the polypropylene film according to embodiments of the present invention means a polypropylene film other than the microporous film. Here, the microporous film is defined as a film having a pore structure that penetrates both surfaces of the film and has air permeability of 5,000 seconds/100 ml or less at a permeation time of 100 ml of air at 23° C. and a relative humidity of 65% using a B-type Gurley tester of JIS P 8117 (1998).

In the polypropylene film according to the first aspect of the present invention, it is necessary that the sum of F5 values at 130° C. in a longitudinal direction and a width direction of the film is at least 15 MPa and for dielectric breakdown testing at 130° C., the dielectric breakdown voltage (B150) (V/μm) after heat treatment for 1 minute at 150° C. and the dielectric breakdown voltage (B0) (V/μm) without heat treatment satisfy the following relationship.

$(B150)/(B0) \geq 0.80$

That is, the present inventors have extensively studied for obtaining a polypropylene film which exhibits long-term reliability in a high-temperature environment in capacitor applications, and resultantly found that the sum of the F5 values at 130° C. in the longitudinal direction and the width direction of the film, the relationship between the dielectric breakdown voltage (B150) (V/μm) when the film is heat treated for 1 minute at 150° C. and the dielectric breakdown voltage (B0) (V/μm) when the film is not heat-treated, (B150)/(B0), have a high correlation with the long-term reliability of the capacitor at a high temperature. In the capacitor applications, the first embodiment of the present invention has found that in a polypropylene film capable of exhibiting long-term reliability in a high-temperature environment, it is particularly important to control such that a change in the dielectric breakdown voltage before and after heating the film at a temperature equal to or higher than a use environmental temperature is small in terms of long-term reliability of the capacitor for a long time.

Here, the fact that the dielectric breakdown voltage (B150) (V/μm) after heat treatment is performed on the film for 1 minute at 150° C. and the dielectric breakdown voltage (B0) (V/μm) without the heat treatment satisfy the relationship of $(B150)/(B0) \geq 0.80$ suggests that the film has a small structural change even when heated, and means that the film has a very stable structure particularly in a high-temperature environment. The value of (B150)/(B0) is preferably 0.83 or more, more preferably 0.86 or more, still more preferably 0.89 or more, and most preferably 0.94 or more. As this value is higher, the dielectric breakdown voltage is higher even at a high temperature, and the capacitor can exhibit long-term reliability in a high-temperature environment.

In order to satisfy $(B150)/(B0) \geq 0.80$, as described later, for example, a polypropylene raw material having a high meso-pentad fraction and a cold xylene soluble component (CXS) of less than 1.5% by mass is used, the melt extrusion temperature—before and after the filter, and in the spinneret—is lowered in multiple stages, an area stretch ratio is set to 60 times or more during biaxial stretching and a stretch ratio in the width direction is set to 10.5 times or more, the preheating temperature immediately before biaxial stretching in the width direction after uniaxial stretching in the longitudinal direction is set to the stretching temperature +5° C. to +15° C. in the width direction, and in heat fixation treatment and relaxation treatment steps after the biaxial stretching, first, a relaxation treatment is performed while heat treatment (first stage) at a temperature lower than the stretching temperature in the width direction is performed, and subsequently, the film can be obtained by appropriately subjecting the film to a multi-stage heat fixation treatment and a relaxation treatment in which a heat treatment (second stage) is performed at a temperature lower than the first stage heat treatment temperature and 135° C. or higher, and a heat treatment (third stage) is further performed at 80° C. or higher and lower than the second stage heat treatment temperature while maintaining tension in the width direction.

On the other hand, when the value of (B150)/(B0) is less than 0.80, when the film is used as a capacitor under a high-temperature environment where a high voltage is applied, particularly when the film is placed in a high temperature state for a long time, molecular chain relaxation of the film proceeds to lower the withstand voltage, so that capacitor capacitance reduction, short-circuit breakdown, and the like occur, resulting in a capacitor with poor reliability. The upper limit of the relational expression (B150)/(B0) is not particularly limited, and is practically 0.99 or less. If the value of (B150)/(B0) is set to be larger than 0.99, it is necessary to increase the stretch ratio during film formation, and breakage may occur.

In the polypropylene film according to the second embodiment of the present invention, for the relaxation time T2 of an amorphous component obtained by a pulse NMR method, a relationship between the relaxation time (T2A) (μs) after heat treatment of the film for 1 minute at 150° C. and the relaxation time (T2B) (μs) before heat treatment needs to satisfy the following formula.

$(T2B)/(T2A) \geq 0.90$

The value of (T2B)/(T2A) is preferably 0.92 or more, more preferably 0.95 or more, and most preferably 0.97 or more. As this value is higher, the dielectric breakdown voltage is higher even at a high temperature, and the capacitor can exhibit long-term reliability in a high-temperature environment.

That is, the present inventors have extensively studied for obtaining a polypropylene film which exhibits long-term reliability in a high-temperature environment in capacitor applications, and resultantly found that there is a high correlation between (T2B)/(T2A), which is a parameter regarding the relaxation time T2 of an amorphous component obtained by a pulse NMR method of the film, and the long-term reliability of the capacitor at a high temperature. That is, in the capacitor applications, the present inventors have found that in a polypropylene film capable of exhibiting long-term reliability in a high-temperature environment, it is particularly important to control such that a change in relaxation time T2 of an amorphous component obtained by a pulse NMR method before and after heating the film at a temperature equal to or higher than a use environmental temperature is small in terms of long-term reliability of the capacitor for a long time, and have completed an embodiment of the present invention. Here, the fact that the relationship of (T2B)/(T2A)≥0.90 is satisfied means that a structural change due to amorphous relaxation is small even when the film is heated, and means that the film has a structure in which movement and relaxation of film molecular chains are suppressed particularly in a high-temperature environment, and the film has a very stable structure against heat.

In order for the polypropylene film according to the second embodiment of the present invention to satisfy the relationship of the formula (T2B)/(T2A)≥0.90, it is effective to increase the area stretch ratio in the stretching step during film formation, and particularly to increase the stretch ratio in the width direction by a sequential biaxial stretching method. On the other hand, it has been found that a thermal shrinkage rate tends to increase due to the influence of orientation caused by stretching, and a thermal shrinkage stress also tends to increase. As a result of intensive studies, as described later, by using a polypropylene raw material having a high meso-pentad fraction and a small cold xylene soluble component (CXS), in the related art, deterioration of thermal shrinkage characteristics in the width direction occurs when the polypropylene raw material is stretched at a high ratio in the width direction; however, an unexpected effect of suppressing the deterioration is obtained. Furthermore, it has been found that the effect can be more remarkably obtained by setting the preheating temperature at the time of lateral stretching to a temperature higher than the lateral stretching temperature and subjecting the heat treatment after the lateral stretching to a multi-stage heat fixation treatment and a relaxation treatment. That is, for example, a polypropylene raw material having a meso-pentad fraction of 0.970 or more and a cold xylene soluble component (CXS) of less than 1.5% by mass is used, and the melt extrusion temperature—before and after the filter, and in the spinneret—is lowered in multiple stages (here, "lowered in multiple stages" means that the temperature is decreased in each stage for the stages before and after filtering and the stage of the spinneret as described later. The same applies hereinafter), an area stretch ratio is set to 60 times or more during biaxial stretching and a stretch ratio in the width direction is set to 10.5 times or more, the preheating temperature immediately before biaxial stretching in the width direction after uniaxial stretching in the longitudinal direction is set to the stretching temperature +5° C. to +15° C. in the width direction, and in heat fixation treatment and relaxation treatment steps after the biaxial stretching, first, a relaxation treatment is performed while heat treatment (first stage) at a temperature lower than the stretching temperature in the width direction is performed, and subsequently, the polypropylene film satisfying (T2B)/(T2A)≥0.90 can be easily obtained by appropriately subjecting the film to a multi-stage heat fixation treatment and a relaxation treatment in which a heat treatment (second stage) is performed at a temperature lower than the first stage heat treatment temperature and 135° C. or higher, and a heat treatment (third stage) is further performed at 80° C. or higher and lower than the second stage heat treatment temperature while maintaining tension in the width direction.

On the other hand, when the value of (T2B)/(T2A) is less than 0.90, when the film is used as a capacitor under a high-temperature environment where a high voltage is applied, particularly when the film is placed in a high temperature state for a long time, molecular chain relaxation of the film proceeds to lower the voltage resistance, so that capacitor capacitance reduction, short-circuit breakdown, and the like occur, resulting in a capacitor with poor reliability. The upper limit of the relational expression ((T2B)/(T2A)≥0.90) is not particularly limited, and is practically 0.99 or less. If the value of (T2B)/(T2A) is made to be larger than 0.99, it is necessary to increase the stretch ratio during film formation, and breakage may occur.

In the polypropylene film according to the third embodiment of the present invention, in a linear function ((Tmβ)=xβ$^{0.5}$+y) obtained from a relationship in which a melting peak temperature (Tmβ) (° C.) observed by DSC measurement of each of a treated film heat treated for 1 minute at 150° C. and an untreated film at a temperature raising rate β (° C./min) is defined as a Y-axis, and a value (β$^{0.5}$) obtained by raising the temperature raising rate β (° C./min) to the power of 0.5 is defined as an X-axis, a relationship between a y-section (H1y) (° C.) of the linear function in the treated film and a y-section (H0y) (° C.) of the linear function in the untreated film needs to satisfy the following relationship.

$(H1y)/(H0y) \geq 0.90$

The value of (H1y)/((H0y) is preferably 0.92 or more, more preferably 0.94 or more, and most preferably 0.96 or more. As this value is higher, the dielectric breakdown voltage is higher even at a high temperature, and the capacitor can exhibit long-term reliability in a high-temperature environment. That is, the present inventors have extensively studied for obtaining a polypropylene film which exhibits long-term reliability in a high-temperature environment in capacitor applications, and resultantly found that there is a high correlation between the relationship (H1y)/(H0y) between the y-section (H1y) (° C.) of the treated film and the y-section (H0y) (° C.) of the untreated film, which is derived from a linear function ((Tmβ)=xβ$^{0.5}$+y) as a parameter relating to a melting peak temperature observed by DSC measurement of each of a film heat treated for 1 minute at 150° C. and an untreated film at a temperature raising rate β (° C./min), and the long-term reliability of the capacitor at a high temperature. That is, in the capacitor applications, the present invention according to embodiments has found that in a polypropylene film capable of exhibiting long-term reliability in a high-temperature environment, it is particularly important to control so that changes in the y-section (H1y) (° C.) of a film obtained by heat-treating the film for 1 minute at 150° C. and the y-section (H0y) (° C.) of an untreated film are small in terms of long-term reliability of the capacitor for a long time. Here, the fact that the relationship of (H1y)/(H0y)≥0.90 is satisfied means that a structural change due to amorphous relaxation is small and a melting point change is small even when the film is heated, and means that the film has a structure in which movement and relaxation of film molecular chains are suppressed particularly in a high-temperature environment, and the film has a very stable structure against heat.

In order for the polypropylene film according to embodiments of the present invention to satisfy the relationship of the formula (H1y)/(H0y)≥0.90, it is effective to increase the area stretch ratio in the stretching step during film formation, and particularly to increase the stretch ratio in the width direction by a sequential biaxial stretching method. On the other hand, it has been found that a thermal shrinkage rate tends to increase due to the influence of orientation caused by stretching, and a thermal shrinkage stress also tends to increase. As a result of intensive studies, as described later, by using a polypropylene raw material having a high meso-pentad fraction and a small cold xylene soluble component (CXS), in the related art, deterioration of thermal shrinkage characteristics in the width direction occurs when the polypropylene raw material is stretched at a high ratio in the width direction; however, an unexpected effect of suppressing the deterioration is obtained. Furthermore, it has been found that the effect can be more remarkably obtained by setting the preheating temperature at the time of lateral stretching to a temperature higher than the lateral stretching temperature and subjecting the heat treatment after the lateral stretching to a multi-stage heat fixation treatment and a relaxation treatment. That is, for example, a polypropylene raw material having a meso-pentad fraction of 0.970 or more and a cold xylene soluble component (CXS) of less than 1.5% by mass is used, and the melt extrusion temperature—before and after the filter, and in the spinneret—is lowered in multiple stages (here, "lowered in multiple stages" means that the temperature is decreased in each stage for the stages before and after filtering and the stage of the spinneret as described later. The same applies hereinafter), an area stretch ratio is set to 60 times or more during biaxial stretching and a stretch ratio in the width direction is set to 10.5 times or more, the preheating temperature immediately before biaxial stretching in the width direction after uniaxial stretching in the longitudinal direction is set to the stretching temperature +5° C. to +15° C. in the width direction, and in heat fixation treatment and relaxation treatment steps after the biaxial stretching, first, a relaxation treatment is performed while heat treatment (first stage) at a temperature lower than the stretching temperature in the width direction is performed, and subsequently, the polypropylene film satisfying (H1y)/(H0y)≥0.90 can be obtained by appropriately subjecting the film to a multi-stage heat fixation treatment and a relaxation treatment in which a heat treatment (second stage) is performed at a temperature lower than the first stage heat treatment temperature and 135° C. or higher, and a heat treatment (third stage) is further performed at 80° C. or higher and lower than the second stage heat treatment temperature while maintaining tension in the width direction.

On the other hand, when the value of (H1y)/(H0y) is less than 0.90, when the film is used as a capacitor under a high-temperature environment where a high voltage is applied, particularly when the film is placed in a high temperature state for a long time, a change in melting point of the film greatly relaxes to lower the voltage resistance, so that capacitor capacitance reduction, short-circuit breakdown, and the like occur, resulting in a capacitor with poor reliability. The upper limit of the relational expression ((H1y)/(H0y)≥0.90) is not particularly limited, and is practically 0.99 or less. If the value of (H1y)/(H0y) is made to be larger than 0.99, it is necessary to increase the stretch ratio during film formation, and breakage may occur.

The polypropylene film according to the third embodiment of the present invention preferably has a y-section (H1y) (° C.) of a linear function $((Tm\beta)=x\beta^{0.5}+y)$ in a film (treated film) heat treated for 1 minute at 150° C. of 155° C. or higher. The fact that the y-section (H1y) (° C.) is at a high temperature means that the melting temperature of the film is high and the heat resistance of the film is high, so that short-circuit breakdown hardly occurs particularly when the film is used for a long time in a high-temperature environment as a capacitor, the voltage resistance is maintained, and high reliability can be obtained. The y-section (H1y) (° C.) is more preferably 157° C. or higher, still more preferably 159° C. or higher, particularly preferably 161° C. or higher. The upper limit of the y-section (H1y) (° C.) is not particularly limited, and it is practical that the y-section (H1y) (° C.) is 170° C. or lower. If the y-section (H1y) (° C.) is made to be higher than 170° C., it is necessary to increase the stretch ratio during film formation, and breakage may occur. In order to control the y-section (H1y) (° C.) of the linear function $((Tm\beta)=x\beta^{0.5}+y)$ in the treated film to the above-described range (155° C. or higher), as described later, it is possible to use, for example, a polypropylene raw material having a high meso-pentad fraction and a cold xylene soluble component (CXS) of less than 1.5% by mass, to lower the melt extrusion temperature—before and after the filter, and in the spinneret—in multiple stages, and to set the area stretch ratio to 60 times or more and the stretch ratio in the width direction to 10.5 times or more during the biaxial stretching.

The polypropylene film of the present invention preferably has a film dielectric breakdown voltage (B0) (V/μm) of 350 V/μm or more at 130° C. It is more preferably to have 375 V/μm or more, still more preferably 400 V/μm or more, particularly preferably 420 V/μm or more, and most preferably 440 V/μm or more. The upper limit is not particularly limited, and is about 800 V/μm. If the value of (B0) (V/μm) is 350 V/μm or more, short-circuit breakdown hardly occurs particularly when the film is used for a long time in a high-temperature environment as a capacitor, the voltage resistance is maintained, and high reliability can be obtained. In order to control the film dielectric breakdown voltage (B0) (V/μm) at 130° C. to be in the above-mentioned range (350 V/μm or more), as described later, it is possible to use, for example, a polypropylene raw material having a high meso-pentad fraction and a cold xylene soluble component (CXS) of less than 1.5% by mass, to lower the melt extrusion temperature—before and after the filter, and in the spinneret—in multiple stages, and to set the area stretch ratio to 60 times or more and the stretch ratio in the width direction to 10.5 times or more during the biaxial stretching.

In the polypropylene film according to embodiments of the present invention, the sum of F5 values at 130° C. in the longitudinal direction and the width direction of the film needs to be 15 MPa or more. When the sum of the F5 values at 130° C. is 15 MPa or more, it means that sufficient film strength is maintained even at a high temperature, and in particular, the short-circuit breakdown hardly occurs particularly when the film is used for a long time in a high-temperature environment as a capacitor, the voltage resistance is maintained, and high reliability can be obtained. The sum of the F5 values at 130° C. is more preferably 17 MPa or more, still more preferably 19 MPa or more, and particularly preferably 21 MPa or more. In order to set the sum of the F5 values at 130° C. to 15 MPa or more, as described later, for example, a polypropylene raw material having a high meso-pentad fraction and a cold xylene soluble component (CXS) of less than 1.5% by mass is used, an area stretch ratio is set to 60 times or more during biaxial stretching and a stretch ratio in the width direction is set to 10.5 times or more, the preheating temperature immediately before biaxial stretching in the width direction after uniaxial stretching in the longitudinal direction is set to the stretching temperature +5° C. to +1.5° C. in the width direction, and in heat fixation treatment and relaxation treatment steps after the biaxial stretching, first, a relaxation treatment is performed while heat treatment (first stage) at a temperature lower than the stretching temperature in the width direction is performed, and subsequently, the film can be obtained by appropriately subjecting the film to a multi-stage heat fixation treatment and a relaxation treatment in which a heat treatment (second stage) is performed at a temperature lower than the first stage heat treatment temperature and 135° C. or higher, and a heat treatment (third stage) is further performed at 80° C. or higher and lower than the second stage heat treatment temperature while maintaining tension in the width direction.

On the other hand, when the sum of the F5 values at 130° C. in the longitudinal direction and the width direction of the film is less than 15 MPa, the mechanical strength at a high temperature is low, so that a capacitor is poor in withstand voltage. The upper limit of the sum of F5 values at 130° C. is not particularly limited, and is practically 50 MPa or less. When the sum of the F5 values at 130° C. in the longitudinal direction and the width direction of the film is made to be larger than 50 MPa, it is necessary to increase the stretch ratio during film formation, and breakage may occur.

Here, in the polypropylene film of the present invention, the "longitudinal direction" is a direction corresponding to the flow direction in a film producing step (hereinafter, sometimes referred to as "MD"), and the "width direction" is a direction orthogonal to the flow direction in the film producing step (hereinafter, sometimes referred to as "TD"). When the film sample has a shape such as a reel or a roll, it can be said that a film winding direction is the longitudinal direction. On the other hand, in the case of a film in which it is unknown which direction corresponds to the flow direction in the film producing step from the appearance of the film, for example, lines are drawn at intervals of 15° with respect to an optional straight line on the film plane, a slit-shaped film piece is sampled in parallel to each line, the breaking strength is obtained by a tensile tester, a direction in which the maximum breaking strength is given is regarded as a film width direction, and a direction orthogonal to the film width direction is regarded as a longitudinal direction. Although details will be described later, when the width of the sample is less than 50 mm and the breaking strength cannot be obtained by a tensile tester, the crystal orientation of the a crystal (110) plane of the polypropylene film by wide-angle X-ray is measured as follows and defined as the film longitudinal direction and the film width direction based on the following criteria. That is, an X-ray (CuKα ray) is incident in a direction perpendicular to a film surface, a crystal peak at 2θ=about 14° (α crystal (110) plane) is scanned in a circumferential direction, a direction in which the diffraction intensity of the obtained diffraction intensity distribution is the highest is defined as a film width direction, and a direction orthogonal thereto is defined as a longitudinal direction.

In the polypropylene film according to embodiments of the present invention, a thermal shrinkage stress value (SF 130 MD) (MPa) obtained using a thermomechanical analyzer at 130° C. in the film longitudinal direction is preferably 2.0 MPa or less, more preferably 1.7 MPa or less, still more preferably 1.3 MPa or less, and most preferably less than 1.0 MPa. When the thermal shrinkage stress value (SF 130 MD) (MPa) obtained using the thermomechanical analyzer at 130° C. in the film longitudinal direction is 2.0 MPa or less, the shrinkage of the film itself can be suppressed by heat in a capacitor producing step and a using step, and since an element is not strongly wound and fastened, a self-healing function (self-healing) operates by holding an appropriate gap between film layers, penetrating short-circuit breakdown accompanied by rapid capacity reduction can be suppressed, and the reliability as a capacitor can be enhanced. The lower limit of the thermal shrinkage stress value (SF 130 MD) (MPa) obtained using a thermomechanical analyzer at 130° C. in the film longitudinal direction is not particularly limited, and is practically about 0.1 MPa. At a shrinkage stress lower than 0.1 MPa, shrinkage of the film itself may be insufficient due to heat in the capacitor producing step and a using step, and sufficient capacity may not be developed with respect to the designed capacity. In order to control the thermal shrinkage stress value (SF 130 MD) (MPa) obtained using a thermomechanical analyzer in the film longitudinal direction at 130° C. within a preferable range, for example, a polypropylene raw material having a high meso-pentad fraction and a cold xylene soluble component (CXS) of less than 1.5% by mass is used, a stretch ratio in the width direction is set to 10.5 times or more during biaxial stretching, the preheating temperature immediately before biaxial stretching in the width direction after uniaxial stretching in the longitudinal direction is set to the stretching temperature +5° C. to +15° C. in the width direction, and in heat fixation treatment and relaxation treatment steps after the biaxial stretching, first, a relaxation treatment is performed while heat treatment (first stage) at a temperature lower than the stretching temperature in the width direction is performed, and subsequently, the film can be obtained by appropriately subjecting the film to a multi-stage heat fixation treatment and a relaxation treatment in which a heat treatment (second stage) is performed at a temperature lower than the first stage heat treatment temperature and 135° C. or higher, and a heat treatment (third stage) is further performed at 80° C. or higher and lower than the second stage heat treatment temperature while maintaining tension in the width direction.

In the polypropylene film according to embodiments of the present invention, a relationship between the sum of storage elastic moduli (E'135 (MD+TD)) (GPa) obtained by fixed viscoelasticity measurement at 135° C. in the film longitudinal direction and the film width direction and the sum of storage elastic moduli (E'125 (MD+TD)) (GPa) obtained by fixed viscoelasticity measurement at 125° C. in the film longitudinal direction and the film width direction preferably satisfies the following formula.

$$(E'135(MD+TD))/(E'125(MD+TD))>0.80$$

The value of (E'135 (MD+TD))/(E'125 (MD+TD)) is preferably 0.83 or more, more preferably 0.86 or more, and most preferably 0.89 or more. The fact that the ratio of the sum of the storage elastic moduli at 135° C. to the sum of the storage elastic moduli at 125° C. satisfies the above relationship (E'135 (MD+TD))/(E'125 (MD+TD))>0.80) means that the temperature dependence of the storage elastic modulus at a high temperature is small, and means that the film has a structure in which movement and relaxation of film molecular chains are suppressed particularly in a high-temperature environment, and the film has a very stable structure against heat. That is, the dielectric breakdown voltage is higher even at a high temperature, and the long-term reliability in a high-temperature environment can be exhibited when used as a capacitor. The upper limit of the above relational expression is not particularly limited, and is practically 0.99 or less.

In order for the ratio of the sum of the storage elastic modulus at 135° C. to the sum of the storage elastic modulus at 125° C. to satisfy the above relationship (E'135 (MD+TD))/(E'125 (MD+TD))>0.80), as described later, for example, a polypropylene raw material having a high meso-pentad fraction and a cold xylene soluble component (CXS) of less than 1.5% by mass is used, an area stretch ratio is set to 60 times or more during biaxial stretching and a stretch ratio in the width direction is set to 10.5 times or more, the preheating temperature immediately before biaxial stretching in the width direction after uniaxial stretching in the longitudinal direction is set to the stretching temperature +5° C. to +15° C. in the width direction, and in heat fixation treatment and relaxation treatment steps after the biaxial stretching, first, a relaxation treatment is performed while heat treatment (first stage) at a temperature lower than the stretching temperature in the width direction is performed, and subsequently, the film can be obtained by appropriately subjecting the film to a multi-stage heat fixation treatment and a relaxation treatment in which a heat treatment (second stage) is performed at a temperature lower than the first stage heat treatment temperature and 135° C. or higher, and a heat treatment (third stage) is further performed at 80° C. or higher and lower than the second stage heat treatment temperature while maintaining tension in the width direction.

The polypropylene film of the present invention preferably has a total valley side volume of 1 to 12,000 µm$^3$, which is the total volume of valleys having a depth of 20 nm or more in a region of 1,252 µm×939 µm, on at least one surface of the film, from the viewpoint of improving the element workability and improving the voltage resistance by having a small number of surface recesses and moderate lubricity. The total valley side volume is more preferably 300 µm$^3$ or more and still more preferably 600 µm$^3$ or more from the viewpoint of the lower limit. The total valley side volume is more preferably 5,000 µm$^3$ or less, still more preferably 2,500 µm$^3$ or less, and particularly preferably 1,000 µm$^3$ or less from the viewpoint of the upper limit. When the total valley side volume is less than 1 µm$^3$, the film tends to be flat without unevenness on the surface, and in this case, slippage of the film is extremely reduced, so that handleability is deteriorated, wrinkles tend to occur, and element workability may be affected. In addition, when the film is used as a capacitor for a long time, a change in capacitance is increased due to the influence of wrinkles or the like, or when the film is laminated to form a capacitor, there is no appropriate gap between the films, so that the self-healing function (self-healing) is difficult to operate, and the reliability of the capacitor may be lowered. On the other hand, when the volume is more than 12,000 µm$^3$, there are many portions where the thickness is locally small, and there is a possibility that dielectric breakdown occurs from the portions, and the voltage resistance of the film is lowered. In particular, when the film is used for high-voltage capacitor applications, the voltage resistance and reliability in a high-temperature environment may be impaired. By setting the total valley side volume to the above-mentioned preferable range (the total valley side volume is 1 µm$^3$ or more and 12,000 µm$^3$ or less), the surface is less recessed, the possibility of occurrence of dielectric breakdown at low voltage is reduced, the voltage resistance of the film is improved, and particularly when the film is used for high-voltage capacitor applications, the voltage resistance and reliability in a high-temperature environment are improved, and a change in the capacitance when the film is used for a long time as a capacitor can be suppressed. In addition, in the case of the capacitor in which films are laminated, since an appropriate gap can be formed between the films, the self-healing function (self-healing) can be operated, and the reliability of the capacitor can be improved. As a method for controlling the total valley side volume, for example, the total valley side volume can be obtained by using a polypropylene raw material having a high meso-pentad fraction and a cold xylene soluble component (CXS) of less than 1.5% by mass, controlling the casting drum temperature and the stretching temperature in the longitudinal direction within preferable ranges, and setting the area stretch ratio to 60 times or more and the stretch ratio in the width direction to 10.5 times or more during biaxial stretching.

In the polypropylene film according to embodiments of the present invention, a relationship between a F5 value (F5MD) (MPa) in the longitudinal direction and a F5 value (F5TD) (MPa) in the width direction at room temperature preferably satisfies the following formula.

$$(F5TD)/(F5MD) \geq 1.5$$

The value of (F5TD)/(F5MD) is preferably 1.7 or more, more preferably 1.9 or more, and most preferably 2.1 or more. The polypropylene film having a higher value has a higher degree of orientation in TD, and can exhibit a high dielectric breakdown voltage even at a high temperature. In order to satisfy (F5TD)/(F5MD)≥1.5, as described later, for example, the area stretch ratio is set to 60 times or more during biaxial stretching, and the stretch ratio in the width direction is set to 10.5 times or more. The upper limit of the value of (F5TD)/(F5MD) is not particularly limited as long as it is 1.5 or more, and a practically achievable value is considered to be about 4.0.

In the polypropylene film according to embodiments of the present invention, a thermal shrinkage stress value (SF 130 TD) (MPa) obtained using a thermomechanical analyzer at 130° C. in the film width direction is preferably 2.0 MPa or less, more preferably 1.5 MPa or less, still more preferably 1.1 MPa or less, and most preferably 0.9 MPa or less. When the thermal shrinkage stress value (SF 130 TD) (MPa) obtained using a thermomechanical analyzer at 130° C. in the film width direction is 2.0 MPa or less, it is possible to prevent poor contact between a vapor-deposited film electrode portion and a metallikon electrode portion in an aging treatment after metallikon spraying in the capacitor producing step, to obtain a capacitor element having designed capacity, to suppress deformation of the element particularly during long-term high-temperature use, and to prevent capacity reduction and short-circuit breakdown. The lower limit of the thermal shrinkage stress value (SF 130 TD) (MPa) obtained using a thermomechanical analyzer at 130° C. in the film width direction is not particularly limited, and is practically about 0.1 MPa. At a thermal shrinkage stress lower than 0.1 MPa, shrinkage of the film itself may be insufficient due to heat in the capacitor producing step and a using step, and sufficient capacity may not be developed with respect to the designed capacity. In order to control the thermal shrinkage stress value (SF 130 TD) (MPa) obtained using a thermomechanical analyzer in the film width direction at 130° C. within a preferable range, for example, a polypropylene raw material having a high meso-pentad fraction and a cold xylene soluble component (CXS) of less than 1.5% by mass is used, the area stretch ratio is set to 60 times or more during biaxial stretching and the stretch ratio in the width direction is set to 10.5 times or more, and the preheating temperature immediately before biaxial stretching in the width direction after uniaxial stretching in the longitudinal direction is set to the stretching temperature in the width direction +5 to +15° C. The detailed method for measuring the thermal shrinkage stress value obtained using the thermomechanical analyzer at 130° C. is as described below.

In the polypropylene film according to embodiments of the present invention, the value of the ratio (SF 130 MD)/(SF 130 TD) of thermal shrinkage stress values obtained using a thermomechanical analyzer at 130° C. in the film longitudinal direction and width direction is preferably 0.5 or more and 1.7 or less. When the ratio (SF 130 MD)/(SF 130 TD) of the thermal shrinkage stress values is in this range, that is, 0.5 or more and 1.7 or less, the balance of the thermal shrinkage stress in the film plane is good, and the uniformity of the gap between the film layers when the film is used as a capacitor is enhanced, so that the capacitor life span and reliability are improved. The lower limit of the ratio (SF 130 MD)/(SF 130 TD) of the thermal shrinkage stress values is preferably 0.8 or more, more preferably 1.0 or more, and most preferably 1.2 or more. On the other hand, the upper limit of the value of the ratio (SF 130 MD)/(SF 130 TD) of the thermal shrinkage stress values is preferably 1.5 or less, more preferably 1.4 or less, and most preferably 1.3 or less. In order to control the ratio (SF 130 MD)/(SF 130 TD) of the thermal shrinkage stress values to be within a preferable range, that is, to be 0.5 or more and 1.7 or less, as described later, for example, a polypropylene raw material having a high meso-pentad fraction and a cold xylene soluble component (CXS) of less than 1.5% by mass is used, an area stretch ratio is set to 60 times or more during biaxial stretching and a stretch ratio in the width direction is set to 10.5 times or more, the preheating temperature immediately before biaxial stretching in the width direction after uniaxial stretching in the longitudinal direction is set to the stretching temperature +5° C. to +15° C. in the width direction, and in heat fixation treatment and relaxation treatment steps after the biaxial stretching, first, 2% to 20% of relaxation treatment is performed while heat treatment (first stage) at a temperature lower than the stretching temperature in the width direction is performed, and subsequently, the film can be obtained by appropriately subjecting the film to a multi-stage heat fixation treatment and a relaxation treatment in which a heat treatment (second stage) is performed at a temperature lower than the first stage heat treatment temperature and 135° C. or higher, and a heat treatment (third stage) is further performed at 80° C. or higher and lower than the second stage heat treatment temperature while maintaining tension in the width direction.

In the polypropylene film according to embodiments of the present invention, when the polypropylene film is completely dissolved with xylene and then precipitated at room temperature, the polypropylene component (CXS, also referred to as a cold xylene soluble component) dissolved in xylene is preferably less than 1.5% by mass. Here, the cold xylene soluble component (CXS) is considered to correspond to a component that is difficult to crystallize due to low stereoregularity, low molecular weight, or the like. By setting the CXS to less than 1.5% by mass, it is possible to increase the absolute value of the storage elastic modulus of the film at a high temperature, improve the temperature dependence, increase the dielectric breakdown voltage, and improve the thermal dimensional stability. On the other hand, when the CXS is 1.5% by mass or more, problems such as poor temperature dependency of the storage elastic modulus of the film at a high temperature, a decrease in the absolute value of the storage elastic modulus at a high temperature, a decrease in dielectric breakdown voltage, a decrease in thermal dimensional stability, and an increase in leakage current may occur. Therefore, the CXS is preferably 1.3% by mass or less, more preferably 1.1% by mass or less, still more preferably less than 1.0% by mass, and most preferably less than 0.9% by mass. In order to set such a CXS content (CXS of less than 1.5% by mass), a method for enhancing the catalytic activity in obtaining the polypropylene resin to be used, a method for washing the obtained polypropylene resin with a solvent or a propylene monomer itself, or the like can be used. The lower limit of the CXS is not particularly limited, and is practically 0.1% by mass. If the CXS is to be less than 0.1% by mass, the stretchability during film formation may be deteriorated to cause breakage.

The polypropylene used for the polypropylene film of the present invention preferably has a melt flow rate (MFR) of 1 to 10 g/10 min (230° C., 21.18 N load), and more preferably 2 to 5 g/10 min (230° C., 1.18 N load) from the viewpoint of film formability. In order to set the melt flow rate (MFR) to the above value, a method such as controlling an average molecular weight or molecular weight distribution is adopted.

The polypropylene used in the polypropylene film according to embodiments of the present invention is mainly formed of a homopolymer of propylene, but a copolymerization component of another unsaturated hydrocarbon may be used as long as the object of the present invention is not impaired, or a polymer other than a homopolymer of propylene may be blended. Examples of a monomer component other than propylene constituting such a copolymerization component or blend include ethylene, 1-butene, 1-pentene, 3-methylpentene-1, 3-methylbutene-1, 1-hexene, 4-methylpentene-1, 5-ethylhexene-1, 1-octene, 1-decene, 1-dodecene, vinylcyclohexene, styrene, allylbenzene, cyclopentene, norbornene, and 5-methyl-2 norbornene.

The copolymerization amount or blending amount of components other than the propylene component is preferably less than 1 mol % as the copolymerization amount from the viewpoint of dielectric breakdown voltage and heat resistance, and the blending amount is preferably less than 1% by mass of the entire resin constituting the film as the amount of components other than propylene.

The polypropylene film of the present invention may contain a branched polypropylene resin. Specifically, commercially available products of "Profax" (registered trademark) (PF-814 and the like) manufactured by Lyondell. Basell, "Daploy" (WB 130 HMS, WB 135 HMS, and the like) manufactured by Borealis, and "WAYMAX" (MFX8, MFX6, MFX3, and the like) manufactured by Japan Polypropylene Corporation can be appropriately selected and used.

A plurality of branched polypropylene resins such as a Ziegler-Natta catalyst system and a metallocene catalyst system are commercially available, and the metallocene catalyst system having a small amount of low molecular weight components and high molecular weight components and a narrow molecular weight distribution is more preferable from the viewpoint of increasing the withstand voltage of the film and improving the capacitor characteristics. A melt tension of the branched polypropylene resin is preferably 2 cN or more and 40 cN or less from the viewpoint of stretching uniformity. The lower limit of the melt tension is more preferably 3 cN or more, and still more preferably 5 cN or more. The upper limit is more preferably 30 cN or less and still more preferably 20 cN or less. In order to set the melt tension to the above value, a method for controlling the average molecular weight, the molecular weight distribution, the degree of branching in the polypropylene resin, or the like is employed. The content of the branched polypropylene resin is preferably 0.1% to 10% by mass with respect to the entire film. The lower limit of the content of the branched polypropylene resin is more preferably 0.15% by mass, and more preferably 0.2% by mass. On the other hand, the upper limit is more preferably 9% by mass, and more preferably 8% by mass. By setting the content of the branched polypropylene resin within the above range, a spherulite size generated in a cooling step of a melt-extruded resin sheet can be easily controlled to be small, the generation of insulating defects generated in a stretching step can be suppressed to be small, and a polypropylene film excellent in high-temperature withstand voltage can be obtained.

The polypropylene resin used for the polypropylene film of the present invention may contain various additives, for example, organic particles, inorganic particles, a crystal nucleating agent, an antioxidant, a heat stabilizer, a chlorine scavenger, a sliding agent, an antistatic agent, an antiblocking agent, a filler, a viscosity modifier, and a coloring inhibitor as long as the object of the present invention is not impaired.

When an antioxidant is contained among these, selection of the type and additional amount of the antioxidant is important from the viewpoint of long-term heat resistance. That is, the antioxidant is preferably a phenol-based antioxidant having steric hindrance, and at least one of the antioxidants is preferably a high molecular weight type having a molecular weight of 500 or more. Specific examples thereof include various compounds, and for example, 1,3,5-trimethyl-2, 4,6-tris(3,5-di-t-butyl-4-hydroxybenzyl) benzene (for example, Irganox (registered trademark) 1330 manufactured by BASF: molecular weight 775.2), tetrakis [methylene-3(3,5-di-t-butyl-4-hydroxyphenyl) propionate]methane (for example, Irganox (registered trademark) 101.0 manufactured by BASF: molecular weight: 1,177.7), or the like is preferably used in combination with 2,6-di-t-butyl-p-cresol (BHT: molecular weight: 220.4). The total content of these antioxidants is preferably in the range of 0.1% to 1.0% by mass with respect to the total amount of polypropylene. If the amount of the antioxidant is too small, the long-term heat resistance may be poor. If the amount of the antioxidant is too large, blocking at a high temperature due to bleed-out of the antioxidant may adversely affect the capacitor element. The total content is more preferably 0.2% to 0.7% by mass, and particularly preferably 0.2% to 0.4% by mass with respect to the mass of the entire resin.

In the polypropylene film of the present invention, the meso-pentad fraction of the film is preferably 0.970 or more. The meso-pentad fraction is more preferably 0.975 or more, still more preferably 0.980 or more, and most preferably 0.983 or more.

The meso-pentad fraction is an index indicating stereoregularity of a crystal phase of polypropylene measured by a nuclear magnetic resonance method (NMR method), and in the present invention, the meso-pentad fraction is preferably 0.970 or more because it has a high degree of crystallinity, a high melting point, an effect of increasing a storage elastic modulus at a high temperature, and an ability of improving a dielectric breakdown voltage in a high-temperature environment. The upper limit of the meso-pentad fraction is not particularly limited. In the present invention, the polypropylene resin having a high meso-pentad fraction is particularly preferably produced by a so-called Ziegler-Natta catalyst, and a method of appropriately selecting an electron donating component in the catalyst or the like is preferably employed. The polypropylene resin obtained thereby can have a molecular weight distribution (Mw/Mn) of 3.0 or more and a <2,1> erythro site defect of 0.1 mol % or less, and it is preferable to use such a polypropylene resin.

The melting point of the polypropylene resin used in the polypropylene film of the present invention is preferably 164° C. or higher, more preferably 166° C. or higher, still more preferably 167° C. or higher, and most preferably 168° C. or higher. When the melting point of the polypropylene resin is lower than 164° C., the crystallinity is low, so that the storage elastic modulus at a high temperature may be lowered, the dielectric breakdown voltage of the film in a high-temperature environment may be lowered, and thermal dimensional stability may be deteriorated, and the film may be broken during film conveyance in a step of forming a metal layer by vapor deposition or in a step of winding a capacitor element.

The polypropylene film of the present invention preferably has a film thickness of 0.5 µm or more and less than 10 µm from the viewpoint of being suitable for a heat-resistant film capacitor of a thin film required for automobile applications (including hybrid car applications) and the like particularly used in a high-temperature environment. The film thickness is more preferably 0.6 µm or more and 8 µm or less, still more preferably 0.8 µm or more and 6 µm or less, and most preferably 0.8 µm or more and 4 µm or less in terms of a balance between characteristics and a capacitor size due to thinning as the heat-resistant film capacitor application.

The polypropylene film of the present invention is preferably in the form of a monolayer film, and may be in the form of a laminated film.

The polypropylene film of the present invention is preferably used as a dielectric film for a capacitor, but the type of the capacitor is not limited. Specifically, from the viewpoint of the electrode configuration, it may be either a combined winding capacitor of a metal foil and a film or a vapor deposited metal film capacitor, and is also preferably used for an oil-impregnated capacitor impregnated with an insulating oil or a dry capacitor that does not use an insulating oil at all. However, from the characteristics of the film of the present invention, it is particularly preferably used as a vapor deposited metal film capacitor. From the viewpoint of the shape, it may be a winding type or a lamination type.

Since a polypropylene film usually has low surface energy and it is difficult to stably perform metal vapor deposition, it is preferable to perform a surface treatment before vapor deposition for the purpose of improving adhesion to a metal layer. Specific examples of the surface treatment include a corona discharge treatment, a plasma treatment, a glow treatment, and a flame treatment. Usually, a surface wet tension of the polypropylene film is about 30 mN/m, but by these surface treatments, it is preferable to set the wet tension to 37 to 75 mN/m, preferably 39 to 65 mN/m, and most preferably about 41 to 55 mN/m because the adhesion to the metal layer is excellent and security is also good.

The polypropylene film of the present invention can be obtained by biaxial stretching, a heat treatment, and a relaxation treatment using a raw material capable of giving the above-mentioned characteristics. As a method of the biaxial stretching, any of an inflation simultaneous biaxial stretching method, a tenter simultaneous biaxial stretching method, and a tenter sequential biaxial stretching method can be employed, and among them, a tenter sequential biaxial stretching method is preferably employed in terms of controlling the film formation stability, a crystalline/amorphous structure, and the surface characteristics, particularly the mechanical characteristics and thermal dimensional stability while increasing the stretch ratio in the width direction of the present invention.

Next, a method for producing the polypropylene film according to embodiments of the present invention will be described as an example. First, a polypropylene resin is melt-extruded onto a support to form an unstretched polypropylene film. This unstretched polypropylene film is stretched in the longitudinal direction, then stretched in the width direction, and sequentially biaxially stretched. Thereafter, the heat treatment and the relaxation treatment are performed to produce a biaxially oriented polypropylene film. Hereinafter, the present invention will be described more specifically, but the present invention is not necessarily interpreted to be limited thereto.

First, from the viewpoint of suppressing the change in the relaxation time T2 of the amorphous component before and after heating the film and reducing the dielectric breakdown voltage at high temperature, the structural stability against heat, and the leakage current, a polypropylene resin having a CXS of less than 1.5% by mass is passed through a melt extrusion filtration filter from a single screw extruder set at an extrusion temperature of 220° C. to 280° C., preferably 230° C. to 270° C., and then extruded from a slit-shaped spinneret at a temperature of 200° C. to 260° C., more preferably 210° C. to 240° C. Here, from the viewpoint that the film structure can be stabilized without being relaxed even at a high temperature by sufficiently melting the resin at the time of melt extrusion and preventing the cutting of the molecular chain length due to shearing by screw rotation, it is preferable to set the temperature to a high temperature before the filtration filter and a low temperature after passing through the filter, and the temperature of the spinneret immediately before discharge is set to a temperature that can achieve a multi-stage low temperature in which the temperature is further lowered. The molten sheet extruded from the slit-shaped spinneret is solidified on a casting drum (cooling drum) controlled at a temperature of 40° C. to 110° C. to obtain an unstretched polypropylene film. As a method for bringing the molten sheet into close contact with a casting drum, any one of an electrostatic application method, an adhesion method using the surface tension of water, an air knife method, a press roll method, an underwater casting method, an air chamber method, and the like may be used, but an air knife method having good flatness and capable of controlling surface roughness is preferable. In addition, in order not to cause vibration of the film, it is preferable to appropriately adjust the position of the air knife so that the air flows to the downstream side of the film formation. The temperature of the casting drum is preferably 60° C. to 110° C., and more preferably 80° C. to 110° C. from the viewpoint of improving the element workability and improving the voltage resistance by having a small surface recess and moderate lubricity.

Next, the unstretched polypropylene film is biaxially stretched to be biaxially oriented. The unstretched polypropylene film is preheated by being passed between rolls maintained at 70° C. to 150° C., and preferably 80° C. to 145° C., and subsequently the unstretched polypropylene film is maintained at a temperature of 70° C. to 150° C., preferably 80° C. to 145° C., stretched 2 to 15 times, preferably 4.5 to 12 times, and more preferably 5.5 to 10 times in the longitudinal direction, and then cooled to room temperature.

Next, the film is guided to the tenter while the end of the film uniaxially stretched in the longitudinal direction is held by the clip. Here, in embodiments of the present invention, when the temperature of the preheating step immediately before stretching in the width direction is set to the stretching temperature in the width direction +5° C. to +15° C., preferably +5° C. to +12° C., and more preferably +5° C. to +10° C., a fibril structure highly oriented in the longitudinal direction by uniaxial stretching can be further strengthened, and the change in the dielectric breakdown voltage before and after film heating can be suppressed. In addition, it is preferable from the viewpoint that the thermal dimensional stability can be improved by stabilizing a molecular chain having insufficient orientation by high temperature preheating after uniaxial stretching. When the preheating temperature is lower than the stretching temperature +5° C., the change in the dielectric breakdown voltage before and after heating of the film cannot be suppressed, and the thermal dimensional stability may not be improved. On the other hand, when the preheating temperature is higher than the stretching temperature +15° C., the film may be broken in the stretching step.

Next, the temperature (stretching temperature in the width direction) at which the film is stretched in the width direction while the end of the film is held by the clip is 150° C. to 170° C. and preferably 155° C. to 165° C.

From the viewpoint of suppressing the change in the dielectric breakdown voltage before and after heating the film, the stretch ratio in the width direction is 10.5 to 20 times, more preferably 11 to 19 times, and most preferably 11.5 to 18 times. When the stretch ratio in the width direction is less than 10.5 times, the orientation contribution of the fibril structure highly oriented in the longitudinal direction by uniaxial stretching remains largely, so that a film in which the change in the dielectric breakdown voltage before and after heating the film cannot be suppressed is obtained. It is preferable to increase the stretch ratio in the width direction from the viewpoint that the orientation in the width direction is imparted while a high orientation state in the longitudinal direction is maintained, so that in-plane molecular chain tension is increased, and further, the structural stability against heat can be improved, so that the effect of improving the trade-off thermal shrinkage characteristics can be obtained. On the other hand, when the stretch ratio in the width direction is more than 20 times, film breakage during the film formation is likely to occur, and productivity may be poor.

Here, the area stretch ratio is preferably 60 times or more from the viewpoint of suppressing a change in the dielectric breakdown voltage before and after heating the film and the film is excellent in the long-term use reliability in high-temperature environments when used as a capacitor. In the present invention, the area stretch ratio is obtained by multiplying the stretch ratio in the longitudinal direction by the stretch ratio in the width direction. The area stretch ratio is more preferably 64 times or more, still more preferably 68 times or more, and most preferably 72 times or more.

In the production of the polypropylene film according to embodiments of the present invention, in the subsequent heat treatment and relaxation treatment step, it is preferable that heat fixation (heat treatment at first stage) be performed at a temperature (heat treatment temperature at first stage) of 145° C. or higher and 165° C. or lower and lower than the stretching temperature in the width direction while giving 2% to 20% relaxation in the width direction while tensely gripping the film in the width direction with a clip and heat fixation (heat treatment at second stage) be performed again at a temperature of 135° C. or higher and lower than the heat fixation temperature (heat treatment temperature at first stage) while tensely gripping the film in the width direction with a clip, and a multistage heat treatment in which heat fixation (heat treatment at third stage) is performed at a temperature of 80° C. or higher and lower than the heat fixation temperature (heat treatment temperature at second stage) while tensely gripping the film is further performed, from the viewpoint that change in the dielectric breakdown voltage before and after heating is suppressed, the structural stability against heat is improved, and the voltage resistance and reliability can be obtained when used as a capacitor.

In the relaxation treatment, the relaxation ratio is preferably 2% to 20%, more preferably 5% to 1.8%, and still more preferably 8% to 15% from the viewpoint of enhancing the structural stability against heat. If the relaxation ratio is more than 20%, the film may be excessively slack inside the tenter, wrinkles may be formed in the product, and unevenness may be generated during vapor deposition, or the mechanical characteristics may be deteriorated. On the other hand, if the relaxation ratio is less than 2%, sufficient structural stability against heat cannot be obtained, and capacity reduction or short-circuit breakdown may occur in a high-temperature environment when the film is used as a capacitor.

After the heat treatment for lowering the temperature in multiple stages, the film is guided to the outside of the tenter, the clip at the film end is released in a room temperature atmosphere, the film edge is slit in a winder step, and a film product roll having a film thickness of 0.5 μm or more and less than 10 μm is wound up. Here, in order to improve the adhesiveness of a vapor-deposited metal on a surface to be vapor-deposited before winding the film, it is preferable to perform a corona discharge treatment in air, nitrogen, carbon dioxide, or a mixed gas thereof.

In order to obtain the polypropylene film of the present invention, specific examples of the intended production conditions are as follows.

The melt extrusion temperature should be lowered in multiple stages before and after the filter and in the spinneret.
  The meso-pentad_fraction of the polypropylene resin is 0.970 or more.
  The CXS of the polypropylene resin is less than 1.5% by mass.
  The area stretch ratio of stretching is 60 times or more.
  The stretch ratio in the width direction is 10.5 times or more.
  The preheating temperature before stretching in the width direction is the stretching temperature +5° C. to +15° C. in the width direction.
  The heat treatment temperature at the first stage is 145° C. or higher and 165° C. or lower and lower than the stretching temperature in the width direction.
  The heat treatment temperature at the second stage is 135° C. or higher and lower than the heat treatment temperature at the first stage.
  The heat treatment temperature at the third stage is 80° C. or higher and lower than the heat treatment temperature at the second stage.
  2% to 20% of relaxation treatment is performed in the width direction in the heat treatment step at the first stage.

Subsequently, a metal membrane layered film obtained using the polypropylene film according to embodiments of the present invention, a film capacitor obtained using the metal membrane layered film, and a method for producing the metal membrane layered film and the film capacitor will be described.

The metal layer laminated film according to embodiments of the present invention has a metal layer on at least one surface of the polypropylene film according to embodiments of the present invention. This metal layer laminated film can be obtained by providing a metal layer on at least one surface of the polypropylene film according to embodiments of the present invention.

In the present invention, the method for giving a metal layer is not particularly limited, and for example, a method is preferably used in which aluminum or an alloy of aluminum and zinc is vapor-deposited on at least one surface of a polypropylene film to provide a metal layer such as a vapor-deposited film serving as an internal electrode of a film capacitor. At this time, other metal components such as nickel, copper, gold, silver, and chromium can be vapor-deposited simultaneously or sequentially with aluminum. A protective layer can also be provided on the deposited film with oil or the like. When the surface roughness of the polypropylene film is different between the front and back surfaces, it is preferable to provide a metal layer on the surface side having a smooth roughness to form a metal layer laminated film from the viewpoint of enhancing the voltage resistance.

In the present invention, if necessary, after the metal layer is formed, the metal layer laminated film can be subjected to an annealing treatment or a heat treatment at a specific temperature. For insulation or other purposes, at least one surface of the metal layer laminated film may be coated with a resin such as polyphenylene oxide.

The film capacitor according to embodiments of the present invention is formed using the metal layer laminated film according to embodiments of the present invention. That is, the film capacitor according to embodiments of the present invention has the metal layer laminated film according to embodiments of the present invention.

For example, the film capacitor of the present invention can be obtained by laminating or winding the metal layer laminated film of the present invention described above by various methods. A preferred method for producing a wound film capacitor is as follows.

Aluminum is vapor-deposited on one surface of the polypropylene film under reduced pressure. At that time, vapor deposition is performed in a stripe shape having a margin portion running in the longitudinal direction. Next, slits are made with a blade at the center of each vapor deposition portion and the center of each margin portion on the surface to produce a tape-shaped winding reel having a margin on one side of the surface. Two tape-shaped winding reels each having a left margin and a right margin are overlapped and wound such that the deposited portion protrudes from the margin portion in the width direction to obtain a wound body.

When the vapor deposition is performed on both surfaces, the vapor deposition is performed in a stripe shape having a margin portion running in the longitudinal direction on one surface, and the vapor deposition is performed in a stripe shape such that the margin portion in the longitudinal direction is located at the center of the back-surface-side vapor deposition portion on the other surface. Next, slits are made with a blade at the center of each margin portion on the front and back surfaces to produce a tape-shaped winding reel having a margin on one side (for example, if there is a margin on the front right side, a margin is on the left side on back side) on both surfaces. Two sheets of each of the obtained reel and the undeposited laminated film are overlapped and wound so that the metallized film protrudes from the laminated film in the width direction to obtain a wound body.

A wound film capacitor can be obtained by removing a core material from the wound body produced as described above, pressing the wound body, spraying metallikon to both end surfaces to form an external electrode, and welding a lead wire to the metallikon. A film capacitor can be used in a wide variety of applications such as railway vehicles, automobiles (hybrid cars and electric vehicles), solar power generation/wind power generation, and general home appliances, and the film capacitor of the present invention can also be suitably used in these applications. In addition, it can be used in various applications such as a packaging film, a release film, a processing film, a sanitary product, an agricultural product, a building product, and a medical product.

A method for measuring a characteristic value and a method for evaluating an effect in the present invention are as follows.

(1) Film Thickness

A thickness of a polypropylene film was measured at 10 optional positions in an atmosphere of 23° C. and 65% RH using a contact type electronic micrometer (K-312 A type) manufactured by ANRITSU CORPORATION. An arithmetic average value of the thicknesses at 10 positions was taken as a film thickness of the polypropylene film.

(2) Sum of F5 Values in Film Longitudinal Direction and Width Direction at 130° C.

A rectangular polypropylene film (width (short side) 10 mm×length (long side) 150 mm) cut out along a film test length direction (longitudinal direction or width direction) as a long side direction was used as a measurement sample. Next, a sample was set in a sample tensile tester (Tensilon UCT-100 manufactured by ORIENTEC CORPORATION) at an initial chuck distance of 20 mm, and held in an oven temperature-controlled under an environment of 130° C. for 1 minute, and then a tensile test of the film was performed at a tensile speed of 300 mm/min. At this time, the position of the sample in the length direction was adjusted so that the center of the sample was in the vicinity of the center between the chucks. A load applied to the film at 5% elongation of the sample was read, and the value obtained by dividing the load by the cross-sectional area (film thickness×width (10 mm)) of the sample before the test was calculated as a stress at 5% elongation (F5 value, unit: MPa). The measurement was performed five times for each of the samples for measurement in the longitudinal direction and the width direction, an F5 value in the longitudinal, direction or the width direction was obtained as an arithmetic average value thereof, and each was added to obtain a sum.

As the film thickness used for calculating the F5 value, the value measured in the above (1) was used.

(3) Film Dielectric Breakdown Voltage (B0) (V/μm) at 130° C.

The film was heated for 1 minute in an oven maintained at 130° C., and then measured in the atmosphere according to JIS C, 2330 (2001) 7.4.11.2 B method (flat plate electrode method). However, as for the lower electrode, one obtained by placing "Conductive Rubber E-100 <65>" manufactured by TOGAWA RUBBER CO., LTD. having the same dimensions on a metal plate described in Method B of JIS C2330 (2001) 7.4.11.2 was used as an electrode. A dielectric breakdown voltage test was performed 30 times, the obtained value was divided by the thickness of the film (measured in the above (1)) and converted into (V/μm), and 20 points of the average value excluding 5 points in descending order from the maximum value and 5 points in ascending order from the minimum value, out of 30 point of measured values (calculated values) in total, was set as a film dielectric breakdown voltage (B0) (V/μm) at 130° C.

(4) NMR Relaxation Time (T2B) and (T2A) and the Ratio (T2B)/(T2A)

In a method for heat-treating a film for 1 minute at 150° C., a square metal frame having a thickness of 2 mm, an outer dimension of 300 mm×300 mm, and a width of 20 mm that is hollowed out to an inner dimension of 280 mm×280 mm is used. Double-sided tapes ("NICE TACK" NW-H15 adhesive force 02 manufactured by Nichiban Co., Ltd.) are attached to four sides of the frame surface, the film is attached so that the film covers the entire surface of the metal frame, and the film is sandwiched between metal frames having the same dimensions. At this time, the film is attached so as not to be wrinkled. Next, in a state of metal frame/double-sided tape/film/metal frame, a sample in which four sides of the frame were sandwiched and fixed with clips was prepared, and the sample was left in an oven heated to 150° C. for 1 minute. After 1 minute, the sample was taken out and allowed to stand at room temperature for 5 minutes, and then the film was cut out along the inner frame of the metal frame to obtain a film after heat treatment at 150° C. for 1 minute. When a film having a size of 300 mm×300 mm was not obtained, a metal frame having a dimension capable of being attached was used.

Subsequently, the relaxation time (T2B) (μs) of the amorphous component of the polypropylene film by the pulse NMR method before the heat treatment for 1 minute at 150° C. and the relaxation time (T2A) (μs) of the amorphous component of the polypropylene film by the pulse NMR method after the treatment were determined by the following apparatus and conditions, and the ratio (T2B)/(T2A) was calculated.

Apparatus: mq 20 manufactured by Bruker Biospin
Temperature: 40° C.
Observation frequency: 20 MHz
90° Pulse width: 2.74 μs
Pulse repeating time: 2.0 s
Pulse mode: Solido Echo method In the measurement, for each of the film before the heat treatment and the film after the heat treatment, the film was cut and the film cut to a height of 1 cm was packed in a glass tube having an outer diameter of 10 mm, and a spin-spin relaxation time T2 of 1H nucleus was obtained for the amorphous component of the polypropylene film. The measurement was started after the film was put into the apparatus and kept warm for 15 minutes, and the obtained attenuation curve was separated into a short Gaussian component of T2 and a long exponential component of T2 by a least squares method. Incidentally, the short-time component corresponds to the crystal component, and the long-time component corresponds to the amorphous component.

(5) y-Section (H1y) (° C.) of Linear Function ((Tmβ)=xβ$^{0.5}$+y) with Respect to Melting Point and Ratio of (H1y)/(H0y)

In a method for heat-treating a film for 1 minute at 150° C., a square metal frame having a thickness of 2 mm, an outer dimension of 300 mm×300 mm, and a width of 20 mm that is hollowed out to an inner dimension of 280 mm×280 mm is used. Double-sided tapes ("NICE TACK" NW-H15 adhesive force 02 manufactured by Nichiban Co., Ltd.) are attached to four sides of the frame surface, the film is attached so that the film covers the entire surface of the metal frame, and the film is sandwiched between metal frames having the same dimensions. At this time, the film is attached so as not to be wrinkled. Next, in a state of metal frame/double-sided tape/film/metal frame, a sample in which four sides of the frame were sandwiched and fixed with clips was prepared, and the sample was left in an oven heated to 150° C. for 1 minute. After 1 minute, the sample was taken out and allowed to stand at room temperature for 5 minutes, and then the film was cut out along the inner frame of the metal frame to obtain a film after heat treatment at 150° C. for 1 minute. When a film having a size of 300 mm×300 mm was not obtained, a metal frame having a dimension capable of being attached was used.

That is, in a linear function $((Tm\beta)=x\beta^{0.5}+y)$ obtained from a relationship in which a melting peak temperature (Tmβ) (° C.) observed by DSC measurement of each of a treated film heat treated for 1 minute at 150° C. and an untreated film at a temperature raising rate β (° C./min) is defined as a Y-axis, and a value $(\beta^{0.5})$ obtained by raising the temperature raising rate β (° C./min) to the power of 0.5 is defined as an X-axis, a y-section (H1y) (° C.) of the linear function in the treated film and a y-section (H0y) (° C.) of the linear function in the untreated film were obtained, and a ratio (H1y)/(H0y) was calculated. When a plurality of melting points were observed at each temperature raising rate, the lowest melting point in the range of 150° C. to 170° C. was used.

Apparatus: DSC 8500 manufactured by Perkin-Elmer Co., Ltd.
Data processing: "TRC-THADAP-DSC" manufactured by Toray Research Center, Inc.
Apparatus atmosphere: Nitrogen (20 mL/min)
Temperature/heat calibration: High purity indium (Tm=156.61° C., ΔHm=28.70 J/g)
Temperature range: about −50° C. to 250° C.
Temperature raising rate: 5° C./min, 20° C./min, 50° C./min, 100° C./min
Sample amount: The sample weight was changed according to the temperature raising rate in consideration of temperature follow-up.
4 mg at 5° C./min, 2 mg at 20° C./min, 1.5 mg at 50° C./min, 0.5 mg at 100° C./min
(Here, a DSC curve is expressed by normalizing the sample weight to 5.0 mg.)
Sample container: Standard container made of aluminum.

(6) Ratio (B150)/(B0) of Dielectric Breakdown Voltage at 130° C.

In a method for heat-treating a film for 1 minute at 150° C., a square metal frame having a thickness of 2 mm, an outer dimension of 300 mm×300 mm, and a width of 20 mm that is hollowed out to an inner dimension of 280 mm×280 mm is used. Double-sided tapes ("NICE TACK" NW-H15 adhesive force 02 manufactured by Nichiban Co., Ltd.) are attached to four sides of the frame surface, the film is attached so that the film covers the entire surface of the metal frame, and the film is sandwiched between metal frames having the same dimensions. At this time, the film is attached so as not to be wrinkled. Next, in a state of metal frame/double-sided tape/film/metal frame, a sample in which four sides of the frame were sandwiched and fixed with clips was prepared, and the sample was left in an oven heated to 150° C. for 1 minute. After 1 minute, the sample was taken out and allowed to stand at room temperature for 5 minutes, and then the film was cut out along the inner frame of the metal frame to obtain a film after heat treatment at 150° C. for 1 minute. When a film having a size of 300 mm×300 mm was not obtained, a metal frame having a dimension capable of being attached was used. The film heat treated for 1 minute at 150° C. was subjected to a dielectric breakdown test in an atmosphere at 130° C. in the same manner as in (3) to obtain the dielectric breakdown voltage (B150) (V/μm). Next, the ratio of the dielectric breakdown voltage (B0) (V/μm) at 130° C. obtained in (3) to (B150) was calculated, and the value of (B150)/(B0) was obtained.

(7) Ratio of Sum of Storage Elastic Moduli ((E'135 (MD+TD))/(E'125 (MD+TD)))

Under the following apparatus and conditions, a rectangular polypropylene film (width (short side) 10 mm×length (long side) 50 mm) cut out along a film test length direction (longitudinal direction or width direction) as a long side direction was attached to an apparatus chuck portion under an atmosphere of 23° C., and the temperature was raised from 23° C. to 260° C. to perform measurement. A viscoelasticity-temperature curve was drawn by a dynamic viscoelasticity method, and a storage elastic modulus (E'125) (GPa) at 125° C. and a storage elastic modulus (E'135) (GPa) at 135° C. were read. The number of measurement tests was n=5, and the average value of the remaining n=3 excluding the maximum value and the minimum value therein was set as the storage elastic modulus in that direction, and the storage elastic modulus was measured in each of the longitudinal direction and the width direction of the film. From the obtained results, the sum of the storage elastic moduli at 125° C. in the longitudinal direction and the width direction (E'125 (MD+TD)) (GPa) and the sum of the storage elastic moduli at 135° C. in the longitudinal direction and the width direction (E'135 (MD+TD)) (GPa) were calculated, and ((E'135 (MD+TD))/(E'125 (MD+TD))) was calculated.

Apparatus: EXSTAR DMS 6100 (manufactured by Seiko Instruments Inc.)
Test mode: Tensile mode
Distance between chucks: 20 mm
Frequency: 1 Hz
Strain amplitude: 10.0 μm
Gain: 1.5
Initial value of force amplitude: 400 mN
Temperature range: 23° C. to 260° C.
Temperature raising rate: 2° C./min
Measurement atmosphere: Nitrogen
Measured thickness: The film thickness was obtained by the method of the above (1).

(8) Thermal Shrinkage Stress at 130° C. in Film Longitudinal Direction and Film Width Direction (SF 130) (MPa), Ratio of Thermal Shrinkage Stress at 130° C. ((SF 130 MD)/(SF 130 TD))

A polypropylene film was cut into a rectangular sample having a width of 4 mm and a length of 50 mm along the measurement direction (longitudinal direction) of the film as a long side, and the film was sandwiched between metal chucks so as to have a test length of 20 mm. The sample sandwiched between the chucks was set in the following apparatus, and the stress curve in the longitudinal direction in the film whose test length was kept constant was obtained by the following temperature program. From the obtained stress curve, the shrinkage stress SF 130 (MPa) of the film at 130° C. was read. The ratio ((SF 130 MD)/(SF 130 TD)) of the thermal shrinkage stress at 130° C. was calculated from the ratio of the thermal shrinkage stress (SF 130 MD) (MPa) at 130° C. in the longitudinal direction to the thermal shrinkage stress (SF 130 TD) (MPa) at 130° C. in the width direction.

Apparatus: Thermomechanical analyzer TMA/SS 6000 (manufactured by Seiko Instruments Inc.)
Test mode: L control mode
Test length: 20 mm
Temperature range: 23° C. to 200° C.
Temperature raising rate: 10° C./min
SS program: 0.1 μm/min
Measurement atmosphere: Nitrogen
Measured thickness: The film thickness of the above (1) was used.

(9) Total Volume of Valleys with Depth of 20 nm or More in Film Surface (Total Valley Side Volume)

Measurement was performed using VertScan 2.0 R5300 GL-Lite-AC manufactured by Ryoka Systems Inc., and analysis was performed using a bearing function which is an analysis tool of attached analysis software. In order to designate a valley-side gap having a depth of 20 nm or more, the valley side height threshold was set to −20 nm in the height region designation. Then, the analyzed valley-side gap volume value was read and rounded off to two significant digits.

When both surfaces of the film were measured and the total valley side volume fell within the range of 1 to 12,000 μm$^3$, the value of the surface on the side that fell within the range (the value of the surface having a smaller value when both the surfaces are within the range) was given, and when the total valley side volume did not fall within the range on both surfaces, the value of the surface on the side close to the range of 1 to 12,000 μm$^3$ was given.

The measurement conditions are as follows.
Manufacturer: Ryoka Systems Inc.
Apparatus name: VertScan 2.0 R5300 GL-Lite-AC
Measurement conditions: CCD camera SONY HR-57½ inch (1.27 cm)
Objective lens 10×
Intermediate lens 0.5×
Wavelength filter 520 nm white
Measurement mode: Phase
Measurement software: VS-Measure Version 5.5.1
Analysis software: VS-Viewer Version 5.5.1
Measurement area: 1.252×0.939 mm$^2$.

(10) Cold Xylene Soluble Component (CXS) of Film

For a polypropylene resin in a case of a raw material and a film sample in a case of a film, 0.5 g was dissolved in 100 ml of xylene at 135° C. and allowed to cool, and then recrystallized in a thermostatic water bath for 1 hour at 20° C., and then the polypropylene-based components dissolved in a filtrate were quantified by liquid chromatography.

Assuming that the amount of the polypropylene-based component dissolved in the filtrate was set as X (g) and the fine amount value of 0.5 g of the sample was set as X0 (g), CXS was calculated by the following formula.

$$CXS(\%)=(X/X0)\times100$$

(11) Meso-Pentad Fraction

For a polypropylene resin in a case of a raw material and a film sample in a case of a film, each was powdered by freeze pulverization, extracted with n-heptane for 2 hours at 60° C. to remove impurities and additives in polypropylene, and then dried under reduced pressure for 2 hours or more at 130° C. The sample was dissolved in a solvent, and the meso-pentad fraction (mmmm) was obtained using $^{13}$C-NMR under the following conditions.

Measurement Conditions
Apparatus: DRX-500 manufactured by Bruker Corporation
Measurement nucleus: $^{13}$C nucleus (resonance frequency: 125.8 MHz)
Measurement concentration: 10% by mass
Solvent: benzene: deuterated ortho-dichlorobenzene=1:3 mixed solution (volume ratio)
Measurement temperature: 130° C.
Spin rotation speed: 12 Hz
NMR sample tube: 5 mm tube
Pulse width: 45° (4.5 μs)
Pulse repeating time: 10 seconds
Data point: 64 K
Number of integrations: 10,000 times
Measurement mode: Complete decoupling Analysis Conditions Fourier transformation was performed with an LB (line broadening factor) of 1, and the mmmm peak was set to 21.86 ppm. Peak splitting was performed using WINFIT software (manufactured by Bruker Corporation). At that time, the peak splitting was performed from the peak on the high magnetic field side as follows, and automatic fitting of software was further performed to optimize the peak splitting, and then the total of the peak fractions of mmmm was set as the meso-pentad fraction (mmmm).

(1) mrrm
(2) (3) rrrm (divided as two peaks)
(4) rrrr
(5) mrmr
(6) mrmm+rmrr
(7) mmrr
(8) rmmr
(9) mmmr
(10) mmmm The same measurement: was performed five times for the same sample, and the average value of the obtained meso-pentad fractions was set as the meso-pentad fraction of the sample.

(12) Melting Point of Polypropylene Resin

Using a differential scanning calorimeter (EXSTAR DSC 6220 manufactured by Seiko Instruments Inc.), 3 mg of polypropylene chips were heated from 30° C. to 260° C. at a rate of 20° C./min in a nitrogen atmosphere. Next, after holding for 5 minutes at 260° C., the temperature is lowered to 30° C. under the condition of 20° C./min. Further, after holding for 5 minutes at 30° C., the temperature is raised from 30° C. to 260° C. at a rate of 20° C./min. The peak temperature of an endothermic curve obtained at the time of the temperature rise was set as a melting point of the polypropylene resin. When a plurality of peak temperatures can be observed, the highest temperature was set as a melting point of the polypropylene resin.

(13) Ratio of F5 Values (F5TD)/(F5MD)

A rectangular polypropylene film (width (short side) 10 mm×length (long side) 150 mm) cut out along a film test length direction (longitudinal direction or width direction) as a long side direction was used as a measurement sample. Next, a sample was set in a sample tensile tester (Tensilon UCT-100 manufactured by ORIENTEC CORPORATION) at an initial chuck distance of 20 mm, and a tensile test of the film was performed under an environment of room temperature at a tensile speed of 300 mm/min. At this time, the position of the sample in the length direction was adjusted so that the center of the sample was in the vicinity of the center between the chucks. A load applied to the film at 5% elongation of the sample was read, and the value obtained by dividing the load by the cross-sectional area (film thickness×width (10 mm)) of the sample before the test was calculated as a stress at 5% elongation (F5 value, unit: MPa). The measurement was performed five times for each of the samples for measurement in the longitudinal direction and the width direction, the F5 values (F5MD) (MPa) and (F5TD) (MPa) in the longitudinal direction and the width direction were obtained as the arithmetic average values, and the ratio of (F5TD)/(F5MD) was obtained.

As the film thickness used for calculating the F5 value, the value measured in the above (1) was used.

(14) Evaluation of Film Capacitor Characteristics (Reliability at 120° C.)

Aluminum was deposited on one surface (the surface having the higher wet tension when the wet tension is different between the front and back surfaces) of the film in a vacuum deposition pattern having a film resistance of 10 Ω/sq and a so-called T-shaped margin (longitudinal pitch (period) of 17 mm and fuse width of 0.5 mm due to masking oil) in which a margin portion was provided in a direction perpendicular to the longitudinal direction using a vacuum deposition machine manufactured by ULVAC, Inc. to obtain a deposition reel having a film width of 50 mm (end margin width: 2 mm) after slitting.

Then, using this reel, the capacitor element was wound with an element winding machine (KAW-4 NHB) manufactured by KAIDO MFG. CO., LTD., subjected to metallikon, and then subjected to a heat treatment at a temperature of 130° C. for 8 hours under reduced pressure, and a lead wire was attached to finish the capacitor element.

Using the obtained 10 capacitor elements, a so-called step-up test was performed in which a voltage of 250 VDC was applied to the capacitor elements at a high temperature of 120° C., and the applied voltage was gradually increased stepwise at 50 VDC/1 minute after a lapse of 10 minutes at the voltage.

<Reliability>

After increasing the voltage until the electrostatic capacitance decreased to 12% or less with respect to the initial value, the capacitor element was disassembled to examine the state of breakdown, and the reliability was evaluated as follows.

S: There is no change in element shape, and penetrating destruction is not observed.

A: There is no change in element shape, and penetrating destruction within five layers of the film is observed.

B: There is no change in element shape, and penetrating destruction of 6 or more and 10 or less layers of the film is observed.

C: A change in element shape is observed, or penetrating destruction of more than 10 layers is observed.

D: The element shape is greatly changed and destroyed.

In a case of S, it can be used without problems, and in A and B, it can be used depending on conditions. In a case of C and D, it is inferior in practical performance.

EXAMPLES

Hereinafter, the present invention will be described more specifically with reference to Examples.

Example 1

A polypropylene resin produced by Prime Polymer Co., Ltd. having a meso-pentad fraction of 0.984, a melting point of 168° C., a melt flow rate (MFR) of 2.5 g/10 min, and a cold xylene soluble component (CXS) of 0.8% by mass was supplied to an extruder at a temperature of 255° C., melted, passed through a pipe set at 250° C. after passing through a filtration filter, and melt-extruded into a sheet from a T-shaped slit die set at 245° C., and the molten sheet was brought into close contact with a casting drum maintained at 77° C. by an air knife, and cooled and solidified to obtain an unstretched polypropylene film. The unstretched polypropylene film was preheated to 142° C. stepwise by a plurality of roll groups, passed between rolls having a circumferential speed difference as it was, and stretched 6.3 times in the longitudinal direction. Subsequently, the film was guided to a tenter, preheated at a temperature of 169° C. (TD stretching temperature +8° C.) with both ends held by clips in a film width, and then stretched 12.3 times in the width direction at a temperature of 161° C. Furthermore, as a heat treatment and a relaxation treatment at a first stage, a heat treatment was performed at 158° C. while 11% relaxation was applied in the width direction, and as a heat treatment at a second stage, a heat treatment was performed at 143° C. while being held with a clip in the width direction. Finally, as a heat treatment at a third stage, the film was guided to the outside of the tenter through the heat treatment at 114° C., the clip at the end of the film was released, then a film surface (on the casting drum contact surface side) was subjected to a corona discharge treatment in the atmosphere at a treatment intensity of 25 W-min/m$^2$, and a film having a film thickness of 2.2 μm was wound up into a film roll. The characteristics of the polypropylene film and capacitor characteristics of the present examples are as indicated in the Table 1, and the film had extremely good relationships such as a relationship of the sum of F5 values in a film longitudinal direction and a film width direction at 130° C. and a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and was also excellent in reliability as a capacitor.

Examples 2 and 3

A polypropylene film having a thickness of 2.1 μm in Example 2 and a polypropylene film having a thickness of 2.2 μm in Example 3 were obtained in the same manner as in Example 1, except for conditions indicated in the Table 1, which are a temperature of a casting drum for cooling a melt-extruded sheet, a stretch ratio in biaxial stretching, TD preheating, TD stretching, and the heat treatment conditions, by using a polypropylene resin produced by Prime Polymer Co., Ltd. having a meso-pentad fraction of 0.981, a melting point of 166° C., a melt flow rate (MFR) of 3.0 g/10 min, and a cold xylene soluble component (CXS) of 1.4% by mass. The characteristics of the polypropylene film and capacitor characteristics of Examples 2 and 3 are as indicated in the Table 1, and the film had good relationships such as a relationship of a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and was at a level with no problem in reliability in practical use as a capacitor.

Example 4

A polypropylene film having a thickness of 2.1 μm in Example 4 was obtained in the same manner as in Example 1, except for conditions indicated in the Table 1, which are a temperature of a casting drum for cooling a melt-extruded sheet, a stretch ratio in biaxial stretching, TD preheating, TD stretching, and the heat treatment conditions, by using a polypropylene resin produced by Prime Polymer Co., Ltd. having a meso-pentad fraction of 0.982, a melting point of 167° C., a melt flow rate (MFR) of 3.0 g/10 min, and a cold xylene soluble component (CXS) of 0.8% by mass. The characteristics of the polypropylene film and capacitor characteristics of the present examples are as indicated in the Table 1, and the film had good relationships such as a relationship of the sum of F5 values in a film longitudinal direction and a film width direction at 130° C. and a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and was at a level with no problem in reliability in practical use as a capacitor.

Example 5

1.0% by mass of a branched polypropylene resin (high melt tension polypropylene Profax PF-814) produced by Basell was blended with a polypropylene resin produced by Prime Polymer Co., Ltd. having a meso-pentad fraction of 0.981, a melting point of 166° C., a melt flow rate (MFR) of 3.0 g/10 min, and a cold xylene soluble component (CXS) of 1.4% by mass, and the blend was supplied to an extruder at a temperature of 260° C. to obtain a melt-extruded sheet. A polypropylene film having a thickness of 2.1 μm in Example 2 and a polypropylene film having a thickness of 2.2 μm in Example 3 were obtained in the same manner as in Example 2, except for conditions indicated in the Table 1, which are a temperature of a casting drum for cooling, a stretch ratio in biaxial stretching, TD preheating, TD stretching, and the heat treatment conditions. The characteristics of the polypropylene film and capacitor characteristics of Example 5 are as indicated in the Table 1, and the film had good relationships such as a relationship of a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and was at a level with no problem in reliability in practical use as a capacitor.

Examples 6 and 7

An unstretched sheet obtained in the same manner as in Example 1 was simultaneously biaxially stretched in MD and TD at the TD preheating stretching temperature and the TD stretching temperature indicated in Table 1, and a polypropylene film having a thickness of 2.4 μm was obtained in both Example 6 and Example 7 in the same manner as in Example 1 except that the heat treatment conditions were the conditions indicated in the Table 1. The characteristics of the polypropylene film and capacitor characteristics of Example 6 are as indicated in the Table 1, and the film had good relationships such as a relationship of a ratio (B150)/(B0) of a dielectric breakdown strength before and after heating for 1 minute at 150° C., and was at a level with no problem in reliability in practical use as a capacitor. The polypropylene film of Example 7 had good relationships such as a relationship of the ratio (H1y)/(H0y) of the y-section of the film melting point, and had a level with no problem in reliability in practical use as a capacitor.

Example 8

A polypropylene film having a thickness of 2.3 μm in Example 8 was obtained in the same manner as in Example 1 except that the temperature of the casting drum for cooling the melt-extruded sheet was set to 50° C., and the stretch ratio in the biaxial stretching, the TD stretching, and the heat treatment conditions were as indicated in the Table 1. As for the characteristics of the polypropylene film and the capacitor characteristics of this example, as indicated in the Table 1, the relationship of the ratio (T2B)/(T2A) of the NMR relaxation times before and after heating for 1 minute at 150° C. was good, and the reliability in practical use as a capacitor was at a level with no problem.

Example 9

A polypropylene resin produced by Prime Polymer Co., Ltd. having a meso-pentad fraction of 0.984, a melting point of 168° C., a melt flow rate (MFR) of 2.5 g/10 min, and a cold xylene soluble component (CXS) of 0.8% by mass was blended with 3.0% by mass of a branched polypropylene resin ("WAYMAX" MFX3) produced by Japan Polypropylene Corporation, supplied to an extruder at a temperature of 255° C., melted, and passed through a pipe set at 250° C. after passing through a filtration filter to obtain a melt-extruded sheet from a T-shaped slit die set at 245° C. A polypropylene film having a thickness of 2.2 μm in Example 9 was obtained in the same manner as in Example 1 of the temperature of the casting drum for cooling the melt-extruded sheet, and the stretch ratio in the biaxial stretching, the TD preheating, the TD stretching, and the heat treatment conditions. The characteristics of the polypropylene film and capacitor characteristics of the present examples are as indicated in the Table 1, and the film had extremely good relationships such as a relationship of the sum of F5 values in a film longitudinal direction and a film width direction at 130° C. and a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and was also excellent in reliability as a capacitor.

Comparative Example 1

A polypropylene film having a thickness of 2.2 μm in Comparative Example 1 was obtained in the same manner as in Example 1, except for conditions indicated in the Table 1, which are a temperature of a casting drum for cooling a melt-extruded sheet, a stretch ratio in biaxial stretching, TD preheating, TD stretching, and the heat treatment conditions, by using a polypropylene resin produced by Prime Polymer Co., Ltd. having a meso-pentad fraction of 0.981, a melting point of 166° C., a melt flow rate (MFR) of 4.0 g/10 min, and a cold xylene soluble component (CXS) of 1.8% by mass, which was supplied to an extruder at a temperature of 255° C. to be melted, and melt-extruded into a sheet from a T-shaped slit die while the resin temperature after passing through a filtration filter was set to 255° C. The characteristics of the polypropylene film of Comparative Example 1 and capacitor characteristics are as indicated in the Table 1.

Since the polypropylene film of Comparative Example 1 had no gradient in extrusion temperature, had a large amount of CXS as a raw material, and had a low area stretch ratio, the film had insufficient relationships such as a relationship of the sum of F5 values in a film longitudinal direction and a film width direction at 130° C. and a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and the reliability of the capacitor was found to be changed in the element shape and broken, and was at a level with a problem in reliability in practical use.

Comparative Examples 2, 3, and 4

A polypropylene film having a thickness of 2.3 μm in Comparative Examples 2, 3, and 4 was obtained in the same manner as in Example 1 except that the temperature of the casting drum for cooling the melt-extruded sheet, and the stretch ratio in the biaxial stretching, the TD preheating, the TD stretching, and the heat treatment conditions were as indicated in the Tables 1 and 2.

As for the characteristics of the polypropylene film and the capacitor characteristics of these comparative examples, as indicated in the Table 1, the polypropylene film of Comparative Example 2 had the same TD preheating temperature and TD stretching temperature, and thus was not subjected to a heat treatment in multiple stages. Therefore, the film had an insufficient relationships such as a relationship of the sum of F5 values in a film longitudinal direction and a film width direction at 130° C. and a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and the reliability of the capacitor was found to be changed in the element shape, and was at a level with a problem in reliability in practical use.

In addition, the polypropylene film of Comparative Example 3 had a high MD stretch ratio and a low TD stretch ratio, and thus had a small F5 value ratio, a high MD film thermal shrinkage stress, a poor ratio of storage elastic moduli at 135° C. and 125° C., and poor thermal stability. Therefore, the film had insufficient relationships such as a relationship of the sum of F5 values in a film longitudinal direction and a film width direction at 130° C. and a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and the reliability of the capacitor was found to be changed in the element shape and broken, and was at a level with a problem in reliability in practical use.

Furthermore, since the polypropylene film of Comparative Example 4 had a low preheating temperature for TD stretching and was subjected to a two-stage heat treatment under the heat treatment conditions of a low temperature of 130° C. and a high temperature of 140° C., the film thermal shrinkage stress was high in both MD and TD, the ratio of the storage elastic moduli at 135° C. and 125° C. and dielectric breakdown voltage at 130° C. were insufficient, and the thermal stability was poor. Also, the film had insufficient relationships such as a relationship of a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and thus the reliability of the capacitor was found to be changed in the element shape and broken, and was at a level with a problem in reliability in practical use.

Comparative Example 5

A polypropylene film having a thickness of 2.2 μm in Example 5 was obtained in the same manner as in Example 1, except for conditions indicated in the Table 2, which are a temperature of a casting drum for cooling a melt-extruded sheet, a stretch ratio in biaxial stretching, TD preheating, TD stretching, and the heat treatment conditions, by using a polypropylene resin produced by Prime Polymer Co., Ltd. having a meso-pentad fraction of 0.972, a melting point of 165° C., a melt flow rate (MFR) of 4.0 g/10 min, and a cold xylene soluble component (CXS) of 2.4% by mass. As for the characteristics of the polypropylene film and the capacitor characteristics of the present comparative examples, as indicated in the Table 2, since the cold xylene soluble component (CXS) of the polypropylene resin used was large and the cold xylene soluble component (CXS) of the film was large, the thermal shrinkage stress was high. Also, the film had an insufficient relationships such as a relationship of the sum of F5 values in a film longitudinal direction and a film width direction at 130° C. and a ratio (B150)/(B0) of a dielectric breakdown strength before and after heating for 0.1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and thus the reliability of the capacitor was found to be changed in the element shape and broken, and was at a level with a problem in reliability in practical use.

Comparative Example 6

A polypropylene film having a thickness of 2.3 μm in Example 6 was obtained in the same manner as in Example 1, except that 25% relaxation was provided in the width direction as the first stage heat treatment and relaxation treatment under the conditions indicated in the Table 2, which are a temperature of a casting drum for cooling a melt-extruded sheet, a stretch ratio in biaxial stretching, TD preheating, TD stretching, and the heat treatment conditions, by using a polypropylene resin produced by Prime Polymer Co., Ltd. having a meso-pentad fraction of 0.979, a melting point of 167° C., a melt flow rate (MFR) of 2.6 g/10 min, and a cold xylene soluble component (CXS) of 1.8% by mass. As for the characteristics of the polypropylene film and the capacitor characteristics of the present comparative examples, as indicated in the Table 2, since the film had a large cold xylene soluble component (CXS), the same TD preheating temperature and TD stretching temperature, a low area stretch ratio, and a large relaxation treatment, the ratio of the storage elastic moduli at 135° C. and 125° C. and the dielectric breakdown voltage at 130° C. were insufficient, and the thermal stability was poor. Also, the film had insufficient relationships such as a relationship of a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and thus the reliability of the capacitor was found to be changed in the element shape and broken, and was at a level with a problem in reliability in practical use.

Comparative Example 7

A polypropylene film having a thickness of 2.2 μm was obtained in Comparative Example 7 under the conditions indicated in the Table 2, which are a temperature of a casting drum for cooling a melt-extruded sheet, a stretch ratio in biaxial stretching, TD preheating, TD stretching, and the heat treatment conditions, by using 80% by mass of a polypropylene resin produced by Prime Polymer Co., Ltd. having a meso-pentad fraction of 0.975, a melting point of 165° C., a melt flow rate (MFR) of 4.6 g/10 min, and a cold xylene soluble component (CXS) of 1.4% by mass and 20% by mass of a polypropylene resin produced by Japan Polypropylene Corporation having a meso-pentad fraction of 0.970, a melting point of 164° C., a melt flow rate (MFR) of 0.4 g/10 min, and a cold xylene soluble component (CXS) of 1.4% by mass. As for the characteristics of the polypropylene film and the capacitor characteristics of the present comparative example, as indicated in the Table 2, since the film had the same TD preheating temperature and TD stretching temperature and a low area stretch ratio, and was not subjected to a heat treatment, the ratio of the storage elastic moduli at 135° C. and 125° C. and the dielectric breakdown voltage at 130° C. were insufficient, and the thermal stability was poor. Also, the film had insufficient sum of the F5 values in the film longitudinal direction and the width direction at 130° C., and relationships such as a relationship of a ratio (B150)/(B0) of a dielectric breakdown strength before and after heating for 1 minute at 150° C., a relationship of a ratio (T2B)/(T2A) of an NMR relaxation time before and after heating for 1 minute at 150° C., and a relationship of a ratio (H1y)/(H0y) of a y-section of a film melting point, and thus the reliability of the capacitor was found to be changed in the element shape and broken, and was at a level with a problem in reliability in practical use.

Comparative Example 8

A polypropylene film having a thickness of 2.3 am in Comparative Example 8 was obtained in the same manner as in Example 1 except that the temperature of the casting drum for cooling the melt-extruded sheet was set to 25° C., and the stretch ratio in the biaxial stretching, the TD stretching, and the heat treatment conditions were as indicated in the Table 2. As for the characteristics of the polypropylene film and the capacitor characteristics of the present comparative example, as indicated in the Table 2, since the temperature of the casting drum was as low as 25° C., the TD preheating temperature and the TD stretching temperature were the same, and the heat treatment conditions were the two-stage heat treatment under the conditions of a low temperature of 130° C. and a high temperature of 140° C., the sum of the F5 values in the film longitudinal direction and the width direction at 130° C., and a relationship of a ratio (T2B)/(T2A) of an NMR relaxation time before and after heating for 1 minute at 150° C., and a relationship of a ratio (H1y)/(H1y) of a y-section of a film melting point, and therefore, the reliability of the capacitor was found to be changed in the element shape, and was at a level with a problem in reliability in practical use.

TABLE 1

|  |  | Example 1 | Example 2 | Example 3 | Example 4 | Example 5 | Example 6 |
|---|---|---|---|---|---|---|---|
| Casting drum temperature | (° C.) | 77 | 95 | 96 | 96 | 94 | 91 |
| Longitudinal stretch ratio | (times) | 6.3 | 5.7 | 6.2 | 5.8 | 5.6 | 5.8 |
| Lateral stretch ratio | (times) | 12.3 | 11.1 | 12.5 | 12.0 | 11.2 | 10.5 |
| Area stretch ratio | (times) | 77 | 63 | 78 | 70 | 63 | 61 |
| TD preheating temperature | (° C.) | 169 | 173 | 173 | 171 | 174 | 173 |
| TD stretching temperature | (° C.) | 161 | 160 | 159 | 159 | 161 | 160 |
| Heat treatment temperature at first stage | (° C.) | 158 | 157 | 157 | 157 | 156 | 157 |
| Heat treatment temperature at second stage | (° C.) | 143 | 143 | 138 | 145 | 144 | 155 |
| Heat treatment temperature at third stage | (° C.) | 114 | 112 | 90 | 115 | 111 | 90 |
| Sum of F5 values in film longitudinal direction and width direction at 130° C. | (MPa) | 22 | 16 | 19 | 18 | 18 | 16 |
| Ratio (B150)/(B0) of dielectric breakdown voltage at 130° C. | (—) | 0.95 | 0.81 | 0.83 | 0.87 | 0.86 | 0.80 |
| Ratio (T2B)/(T2A) of NMR relaxation time | (—) | 0.97 | 0.90 | 0.92 | 0.95 | 0.92 | 0.89 |
| Ratio (H1y)/(H0y) of y-section of film melting point | (—) | 0.97 | 0.93 | 0.91 | 0.95 | 0.95 | 0.87 |
| y-section (H1y) of melting point of heat-treated film for 1 minute at 150° C. | (μs) | 162 | 158 | 156 | 160 | 159 | 155 |
| Film dielectric breakdown voltage (B0) at 130° C. | (V/μm) | 430 | 365 | 392 | 415 | 382 | 355 |
| Ratio of storage elastic moduli E'135 (MD + TD)/E'125 (MD + TD) | (—) | 0.90 | 0.77 | 0.79 | 0.87 | 0.81 | 0.80 |
| Thermal shrinkage stress at 130° C. in film longitudinal direction | (MPa) | 0.96 | 1.85 | 2.11 | 1.60 | 1.65 | 1.01 |
| Thermal shrinkage stress at 130° C. in film width direction | (MPa) | 0.81 | 1.89 | 2.05 | 1.40 | 1.66 | 0.98 |
| Total valley side volume at depth of 20 nm or more in film surface | (μm$^3$) | 962 | 3851 | 2852 | 1256 | 2412 | 3211 |

TABLE 1-continued

|  |  | | | | | | |
|---|---|---|---|---|---|---|---|
| Xylene cold soluble component (CXS) of film | (% by mass) | 0.8 | 1.4 | 1.4 | 0.8 | 1.4 | 1.4 |
| Ratio of F5 values (F5TD)/(F5MD) | (—) | 2.3 | 2.0 | 1.9 | 2.4 | 2.1 | 1.6 |
| Ratio MD/TD of thermal shrinkage stress at 130° C. | (—) | 1.2 | 1.0 | 1.0 | 1.1 | 1.1 | 1.0 |
| Film thickness | (μm) | 2.2 | 2.1 | 2.2 | 2.1 | 2.2 | 2.4 |
| Film capacitor characteristics (Reliability at 120° C.) | (—) | S | B | B | A | A | B |

|  |  | Example 7 | Example 8 | Example 9 | Comparative Example 1 | Comparative Example 2 |
|---|---|---|---|---|---|---|
| Casting drum temperature | (° C.) | 91 | 50 | 96 | 96 | 97 |
| Longitudinal stretch ratio | (times) | 6.0 | 6.1 | 6.3 | 4.6 | 6.0 |
| Lateral stretch ratio | (times) | 10.6 | 10.5 | 12.0 | 8.8 | 12.2 |
| Area stretch ratio | (times) | 64 | 64 | 76 | 40 | 73 |
| TD preheating temperature | (° C.) | 168 | 168 | 169 | 168 | — |
| TD stretching temperature | (° C.) | 154 | 161 | 161 | 161 | 169 |
| Heat treatment temperature at first stage | (° C.) | 153 | 157 | 157 | 157 | 158 |
| Heat treatment temperature at second stage | (° C.) | 152 | 143 | 144 | 142 | — |
| Heat treatment temperature at third stage | (° C.) | 90 | 112 | 115 | 112 | — |
| Sum of F5 values in film longitudinal direction and width direction at 130° C. | (MPa) | 14 | 16 | 23 | 14 | 18 |
| Ratio (B150)/(B0) of dielectric breakdown voltage at 130° C. | (—) | 0.78 | 0.79 | 0.94 | 0.75 | 0.79 |
| Ratio (T2B)/(T2A) of NMR relaxation time | (—) | 0.89 | 0.90 | 0.96 | 0.88 | 0.88 |
| Ratio (H1y)/(H0y) of y-section of film melting point | (—) | 0.90 | 0.89 | 0.97 | 0.87 | 0.89 |
| y-section (H1y) of melting point of heat-treated film for 1 minute at 150° C. | (μs) | 156 | 155 | 163 | 154 | 156 |
| Film dielectric breakdown voltage (B0) at 130° C. | (V/μm) | 358 | 352 | 465 | 322 | 365 |
| Ratio of storage elastic moduli E'135 (MD + TD)/E'125 (MD + TD) | (—) | 0.78 | 0.81 | 0.89 | 0.76 | 0.77 |
| Thermal shrinkage stress at 130° C. in film longitudinal direction | (MPa) | 1.26 | 1.82 | 0.88 | 1.22 | 2.11 |
| Thermal shrinkage stress at 130° C. in film width direction | (MPa) | 0.95 | 1.91 | 0.80 | 1.62 | 2.20 |
| Total valley side volume at depth of 20 nm or more in film surface | (μm³) | 2889 | 723 | 941 | 15638 | 11685 |
| Xylene cold soluble component (CXS) of film | (% by mass) | 1.4 | 1.4 | 0.8 | 1.8 | 0.8 |
| Ratio of F5 values (F5TD)/(F5MD) | (—) | 1.5 | 2.1 | 2.1 | 1.4 | 2.0 |
| Ratio MD/TD of thermal shrinkage stress at 130° C. | (—) | 1.3 | 1.0 | 1.1 | 0.8 | 1.0 |
| Film thickness | (μm) | 2.4 | 2.3 | 2.2 | 2.2 | 2.3 |
| Film capacitor characteristics (Reliability at 120° C.) | (—) | B | B | S | D | C |

TABLE 2

|  |  | Comparative Example 3 | Comparative Example 4 | Comparative Example 5 | Comparative Example 6 | Comparative Example 7 | Comparative Example 8 |
|---|---|---|---|---|---|---|---|
| Casting drum temperature | (° C.) | 96 | 92 | 97 | 32 | 95 | 25 |
| Longitudinal stretch ratio | (times) | 7.7 | 6.1 | 6.3 | 4.8 | 5.0 | 6.2 |
| Lateral stretch ratio | (times) | 7.9 | 12.1 | 12.0 | 10.0 | 10.0 | 10.8 |
| Area stretch ratio | (times) | 61 | 74 | 76 | 48 | 50 | 67 |
| TD preheating temperature | (° C.) | 169 | 160 | 169 | — | — | — |
| TD stretching temperature | (° C.) | 162 | 160 | 161 | 165 | 165 | 155 |
| Heat treatment temperature at first stage | (° C.) | 159 | 130 | 158 | 165 | — | 128 |
| Heat treatment temperature at second stage | (° C.) | 145 | 140 | 143 | 150 | — | 138 |
| Heat treatment temperature at third stage | (° C.) | 115 | — | 114 | 140 | — | — |
| Sum of F5 values in film longitudinal direction and width direction at 130° C. | (MPa) | 19 | 18 | 14 | 16 | 14 | 14 |

TABLE 2-continued

|  |  | Comparative Example 3 | Comparative Example 4 | Comparative Example 5 | Comparative Example 6 | Comparative Example 7 | Comparative Example 8 |
|---|---|---|---|---|---|---|---|
| Ratio (B150)/(B0) of dielectric breakdown voltage at 130° C. | (—) | 0.78 | 0.79 | 0.77 | 0.77 | 0.75 | 0.81 |
| Ratio (T2B)/(T2A) of NMR relaxation time | (—) | 0.87 | 0.89 | 0.87 | 0.87 | 0.86 | 0.89 |
| Ratio (H1y)/(H0y) of y-section of film melting point | (—) | 0.87 | 0.88 | 0.85 | 0.88 | 0.87 | 0.88 |
| y-section (H1y) of melting point of heat-treated film for 1 minute at 150° C. | (μs) | 156 | 154 | 156 | 154 | 154 | 155 |
| Film dielectric breakdown voltage (B0) at 130° C. | (V/μm) | 362 | 335 | 380 | 310 | 312 | 364 |
| Ratio of storage elastic moduli E'135 (MD + TD)/E'125 (MD + TD) | (—) | 0.76 | 0.78 | 0.75 | 0.77 | 0.78 | 0.81 |
| Thermal shrinkage stress at 130° C. in film longitudinal direction | (MPa) | 2.65 | 2.33 | 2.08 | 2.33 | 2.22 | 2.31 |
| Thermal shrinkage stress at 130° C. in film width direction | (MPa) | 1.35 | 2.40 | 2.02 | 1.31 | 2.65 | 2.51 |
| Total valley side volume at depth of 20 nm or more in film surface | (μm³) | 13632 | 10325 | 3755 | 12151 | 13756 | 423 |
| Xylene cold soluble component (CXS) of film | (% by mass) | 1.8 | 0.8 | 2.4 | 0.8 | 0.8 | 0.8 |
| Ratio of F5 values (F5TD)/(F5MD) | (—) | 1.2 | 1.8 | 2.1 | 1.8 | 1.9 | 1.9 |
| Ratio MD/TD of thermal shrinkage stress at 130° C. | (—) | 2.0 | 1.0 | 1.0 | 1.8 | 0.8 | 0.9 |
| Film thickness | (μm) | 2.3 | 2.3 | 2.2 | 2.3 | 2.2 | 2.3 |
| Film capacitor characteristics (Reliability at 120° C.) | (—) | D | D | D | D | D | C |

The invention claimed is:

1. A polypropylene film, wherein in a linear function, $(Tm\beta)=x\beta^{0.5}+y$, obtained from a relationship in which a melting peak temperature $(Tm\beta)$ (° C.) observed by DSC measurement of each of a film heat treated for 1 minute at 150° C. (a treated film), and an untreated film at a temperature raising rate $\beta$ (° C./min) is defined as a Y axis, and a value of $\beta^{0.5}$ obtained by raising the temperature raising rate $\beta$ (° C./min) to the power of 0.5 is defined as an X axis, a relationship between a y-section (H1y) (° C.) of the linear function in the treated film and a y-section (H0y) (° C.) of the linear function in the untreated film satisfies the following relationship $(H1y)/(H0y) \geq 0.90$.

2. The polypropylene film according to claim 1, wherein the y-section (H1y) (° C.) of the linear function in the treated film is 155° C. or higher.

3. The polypropylene film according to claim 1, wherein in the linear function, $(Tm\beta)=x\beta^{0.5}+y$, obtained from the relationship in which the melting peak temperature $(Tm\beta)$ (° C.) observed by DSC measurement of each of the film heat treated for 1 minute at 150° C. (the treated film), and the untreated film at the temperature raising rate $\beta$ (C/min) is defined as the Y axis, and the value of $\beta^{0.5}$ obtained by raising the temperature raising rate $\beta$ (C/min) to the power of 0.5 is defined as the X axis, the relationship between the y-section (H1y) (° C.) of the linear function in the treated film and the y-section (H0y) (° C.) of the linear function in the untreated film satisfies the following relationship $(H1y)/(H0y) \geq 0.94$.

4. The polypropylene film according to claim 1, wherein the y-section (H1y) (C) of the linear function in the treated film is 159° C. or higher.

* * * * *